(12) United States Patent
Inoue et al.

(10) Patent No.: US 11,391,782 B2
(45) Date of Patent: Jul. 19, 2022

(54) ENERGY STORAGE DEVICE MANAGING APPARATUS, ENERGY STORAGE APPARATUS, PHOTOVOLTAIC POWER GENERATING SYSTEM, DEGRADATION AMOUNT ESTIMATING METHOD, AND COMPUTER PROGRAM

(71) Applicant: GS Yuasa International Ltd., Kyoto (JP)

(72) Inventors: Tatsuya Inoue, Kyoto (JP); Yuya Kihira, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 239 days.

(21) Appl. No.: 16/469,775

(22) PCT Filed: Dec. 19, 2017

(86) PCT No.: PCT/JP2017/045553
§ 371 (c)(1),
(2) Date: Jun. 14, 2019

(87) PCT Pub. No.: WO2018/117105
PCT Pub. Date: Jun. 28, 2018

(65) Prior Publication Data
US 2019/0317155 A1 Oct. 17, 2019

(30) Foreign Application Priority Data
Dec. 21, 2016 (JP) .............................. JP2016-247412

(51) Int. Cl.
*G01R 31/392* (2019.01)
*H01M 10/48* (2006.01)
(Continued)

(52) U.S. Cl.
CPC .......... *G01R 31/392* (2019.01); *H01M 10/48* (2013.01); *H02S 40/32* (2014.12); *H02S 40/38* (2014.12)

(58) Field of Classification Search
CPC . G01R 31/392; G01R 31/3648; H01M 10/48; H01M 10/44; H02S 40/38; H02S 40/32; G01N 27/223
(Continued)

(56) References Cited

U.S. PATENT DOCUMENTS

2006/0038532 A1* 2/2006 Taniguchi ............... B60L 58/20
320/103
2012/0310571 A1 12/2012 Takagi
(Continued)

FOREIGN PATENT DOCUMENTS

JP H 05-322999 A 12/1993
JP 2007-057434 A 3/2007
(Continued)

OTHER PUBLICATIONS

International Search Report (ISR) (PCT Form PCT/ISA/210), in PCT/JP2017/045553, dated Apr. 3, 2018.

*Primary Examiner* — Douglas X Rodriguez
*Assistant Examiner* — Trung Q Nguyen
(74) *Attorney, Agent, or Firm* — McGinn I.P. Law Group, PLLC.

(57) ABSTRACT

An energy storage device managing apparatus that estimates a degradation amount of a full charge capacity of an energy storage device, the energy storage device managing apparatus includes: a measurement unit that measures a temperature of the energy storage device in a power supply state; a timing unit that measures time in a power non-supply state; and a controller. The controller performs interpolation based on a first temperature measured immediately before the
(Continued)

energy storage device becomes the power non-supply state, and a second temperature initially measured after the energy storage device returns to the power supply state, decides a temperature of the energy storage device from a measurement time of the first temperature to a measurement time of the second temperature, and estimates the degradation amount of the full charge capacity based on the decided temperature.

19 Claims, 22 Drawing Sheets

(51) Int. Cl.
*H02S 40/32* (2014.01)
*H02S 40/38* (2014.01)

(58) Field of Classification Search
USPC .......... 324/400, 430, 433, 500, 600, 764.01, 324/103 R, 771, 761.01, 501, 639, 642, 324/702, 76.11, 76.66, 96
See application file for complete search history.

(56) References Cited

U.S. PATENT DOCUMENTS

| | | |
|---|---|---|
| 2015/0120226 A1 | 4/2015 | Tanabe |
| 2015/0291044 A1* | 10/2015 | Adachi .................... H02J 7/04 320/134 |
| 2017/0010332 A1 | 1/2017 | Kagami et al. |

FOREIGN PATENT DOCUMENTS

| | | |
|---|---|---|
| JP | 2008-312282 A | 12/2008 |
| JP | 2011-099691 A | 5/2011 |
| JP | 2011-220900 A | 11/2011 |
| JP | 5024455 B2 | 9/2012 |
| JP | 2013-181875 A | 9/2013 |
| JP | 5382208 B2 | 1/2014 |
| JP | 2014-126412 A | 7/2014 |
| JP | 2014-187808 A | 10/2014 |
| JP | 2015-111104 A | 6/2015 |
| JP | 2015-154671 A | 8/2015 |

* cited by examiner

US 11,391,782 B2

ENERGY STORAGE DEVICE MANAGING APPARATUS, ENERGY STORAGE APPARATUS, PHOTOVOLTAIC POWER GENERATING SYSTEM, DEGRADATION AMOUNT ESTIMATING METHOD, AND COMPUTER PROGRAM

TECHNICAL FIELD

The technique disclosed by the present specification relates to an energy storage device managing apparatus, an energy storage apparatus, a photovoltaic power generating system, a degradation amount estimating method, and a computer program.

BACKGROUND ART

In a secondary battery such as a lithium ion battery, a full charge capacity gradually decreases from an initial value over time. Cycle degradation due to repetition of charge and discharge and time degradation due to the elapsed time after manufacturing are known as a factor causing the decrease in the full charge capacity of the secondary battery. A root law in which actual use of a secondary battery decreases in proportion to power of a half of an elapsed time is known as to a method (mathematical formula model) for estimating a degradation amount that is a decrease amount of the full charge capacity due to time degradation, and the degradation amount of the secondary battery is estimated by the root rule. Japanese Patent No. 5382208 (Patent Document 1) discloses a degradation estimating apparatus using such the technique.

PRIOR ART DOCUMENT

Patent Document

Patent Document 1: Japanese Patent No. 5382208

SUMMARY OF THE INVENTION

Problems to be Solved by the Invention

When an instrument provided with the above degradation estimating apparatus does not supply power to the degradation estimating apparatus as a power supply of the instrument is turned off in order to prevent discharge of the secondary battery, the degradation amount cannot be calculated in the degradation estimating device, and the capacity estimation accuracy of the full charge capacity is decreased. When the power supply of the degradation estimating apparatus is forcedly turned off due to a trouble or the like, the capacity estimation accuracy of the full charge capacity is decreased by a loss of the calculated degradation amount.

The present specification discloses a technique of preventing the decrease in the estimation accuracy of the full charge capacity.

Means for Solving the Problems

The technique disclosed by the present specification is an energy storage device managing apparatus that estimates a degradation amount of a full charge capacity of an energy storage device, the energy storage device managing apparatus includes: a measurement unit that measures a temperature of the energy storage device in a power supply state in which power is supplied to the energy storage device managing apparatus; a timing unit that measures time in a power non-supply state in which the power is not supplied to the energy storage device managing apparatus; and a controller. The controller performs interpolation based on a first temperature measured immediately before the energy storage device becomes the power non-supply state and a second temperature initially measured after the energy storage device returns to the power supply state, decides a temperature of the energy storage device from a measurement time of the first temperature to a measurement time of the second temperature, and estimates the degradation amount of the full charge capacity based on the decided temperature.

Advantages of the Invention

In the technique disclosed by the present specification, the degradation of the estimation accuracy of the full charge capacity can be prevented by interpolating the temperature of the energy storage device in the unmeasured time.

MODES FOR CARRYING OUT THE INVENTION

Outline of the Embodiment

Figure 1:
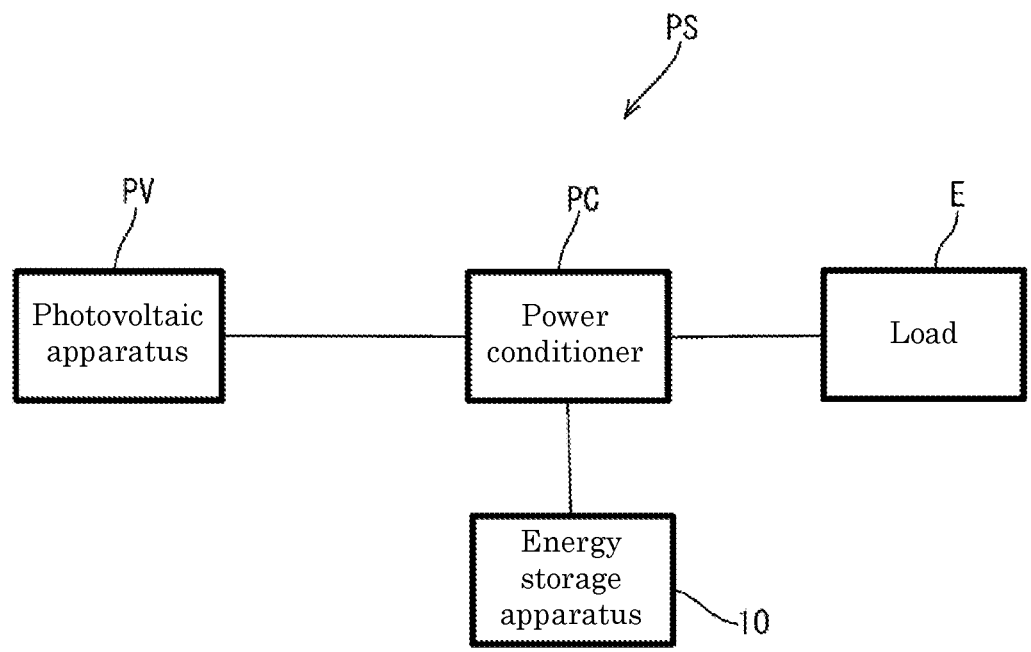
FIG. 1 is a block diagram of a photovoltaic power generating system.

An outline of an energy storage device managing apparatus, an energy storage apparatus, a photovoltaic power generating system, a degradation amount estimating method, and a computer program estimating a degradation amount that are disclosed in the embodiment will be described.

The energy storage device managing apparatus that estimates the degradation amount of a full charge capacity in the energy storage device includes a measurement unit that measures a temperature of the energy storage device in a power supply state in which power is supplied to the energy storage device managing apparatus, a timing unit that measures time in a power non-supply state in which the power is not supplied to the energy storage device managing apparatus, and a controller. The controller performs interpolation based on a first temperature measured immediately before the energy storage device becomes the power non-supply state and a second temperature initially measured after the energy storage device returns to the power supply state, and decides the temperature of the energy storage device from a measurement time of the first temperature to a measurement time of the second temperature, thereby estimating the degradation amount of the full charge capacity based on the decided temperature. The interpolation includes linear interpolation, polynomial interpolation, curve interpolation such as a high-order function and a trigonometric function, and zero-order function (step function) interpolation.

The energy storage apparatus includes the energy storage device and the energy storage device managing apparatus. The photovoltaic power generating system includes a photovoltaic apparatus that converts light into electric power and outputs the power, a power conditioner that converts a DC current generated by the photovoltaic apparatus into an AC current, and the energy storage apparatus.

In the degradation amount estimating method for estimating the degradation amount of the full charge capacity in the energy storage device, the interpolation is performed based on a first temperature measured immediately before the energy storage device becomes the power non-supply state and a second temperature initially measured after the energy storage device returns to the power supply state, and the temperature of the energy storage device from a measurement time of the first temperature to a measurement time of the second temperature is decided, whereby the degradation amount of the full charge capacity is estimated based on the decided temperature.

The computer program estimating the degradation amount of the full charge capacity in the energy storage device causes a computer to perform an acquirement step of acquiring the first temperature measured immediately before the energy storage device becomes the power non-supply state and the second temperature initially measured after the energy storage device returns to the power supply state, an interpolation step of performing the interpolation based on the first temperature and the second temperature, a temperature decision step of deciding the temperature of the energy storage device from the measurement time of the first temperature to the measurement time of the second temperature, and an estimation step of estimating the degradation amount of the full charge capacity based on the decided temperature.

The inventors focus on an increase in an estimation error of the full charge capacity in the energy storage device due to the fact that the measurement unit can hardly measure the temperature of the energy storage device during the power non-supply state in which the power is not supplied to the energy storage device managing apparatus. The inventors found deciding the temperature of the energy storage device from the measurement time of the first temperature to the measurement time of the second temperature based on the first temperature and the second temperature in the measurement unit, and estimating the degradation amount of the full charge capacity based on the decided temperature. By interpolating the temperature of the energy storage device from the measurement time of the first temperature to the measurement time of the second temperature, the degradation of estimation accuracy of the full charge capacity can be prevented without previously storing an environmental temperature or without acquiring temperature information from an outside.

The controller may decide the temperature in each predetermined sampling time in the period from the measurement time of the first temperature to the measurement time of the second temperature, and estimate the degradation amount of the full charge capacity by deciding the degradation amount in each predetermined sampling time based on the temperature in each predetermined sampling time.

With this configuration, the estimation of the degradation amount of the energy storage device based on the temperature in each predetermined sampling time is calculated based on the degradation amount of the energy storage device based on the predetermined sampling time estimated immediately before, and the total degradation amount of the full charge capacity can be estimated in the time from the measurement time of the first temperature to the measurement time of the second temperature. Consequently, the degradation of the estimation accuracy of the degradation amount of the full charge capacity can be prevented as compared with the case of collectively estimating the degradation amount of the full charge capacity in the entire time from the measurement time of the first temperature to the measurement time of the second temperature.

The controller may decide the temperature in each predetermined sampling time on the assumption that the temperature of the energy storage device with respect to time changes in a curved manner from the measurement time of the first temperature to the measurement time of the second temperature.

The inventors study the change in the temperature of the energy storage device after conduction of the energy storage device, and found that the temperature of the energy storage device in the power non-supply state in which the power is not supplied to the energy storage device managing apparatus changes in the curve manner (including the case of rising the temperature of the energy storage device from situations of the energy storage device and the surroundings, in addition to the case of lowering the temperature of the energy storage device).

By interpolating the temperature in each predetermined sampling time on the assumption that the temperature of the energy storage device with respect to the time changes in the curved manner from the measurement time of the first temperature to the measurement time of the second temperature, the degradation of the estimation accuracy of the full charge capacity can further be prevented as compared with the case that a unit temperature of each predetermined sampling time is linearly interpolated in the time from the measurement time of the first temperature to the measurement time of the second temperature.

The controller may estimate the degradation amount of the full charge capacity with an average temperature of the temperature at the measurement time of the second temperature and the temperature at the measurement time of the first temperature as the temperature of the energy storage device in the period from the measurement time of the first temperature to the measurement time of the second temperature. The degradation amount of the full charge capacity can be estimated only by one arithmetic operation by performing the interpolation with the temperature of the energy storage device from the measurement time of the first temperature to the measurement time of the second temperature as the average temperature.

The controller may estimate the degradation amount of the full charge capacity with a higher one of the temperature at the measurement time of the second temperature and the temperature at the measurement time of the first temperature as the temperature of the energy storage device in the period from the measurement time of the first temperature to the measurement time of the second temperature.

By interpolating higher one of the temperature at the time of the second temperature measurement and the temperature at the time of the first temperature measurement as the temperature of the energy storage device from the measurement time of the first temperature to the measurement time of the second temperature, the degradation amount of the full charge capacity can be estimated by only one arithmetic operation while the degradation amount of the full charge capacity is prevented from being estimated to be smaller than the actual one.

First Embodiment

A first embodiment will be described with reference to FIGS. 1 to 11.

FIG. 1 illustrates a photovoltaic power generating system PS in which solar light is used as electromotive force. The photovoltaic power generating system PS includes a photovoltaic apparatus PV, a power conditioner PC, and an energy storage apparatus 10.

The photovoltaic apparatus PV is an apparatus that converts light into electric power by a photovoltaic effect and outputs the electric power, and generates a DC current.

The power conditioner PC converts the DC current generated by the photovoltaic apparatus PV into an AC current. A load E such as an electric appliance is connected to the photovoltaic apparatus PV through the power conditioner PC.

Figure 2:
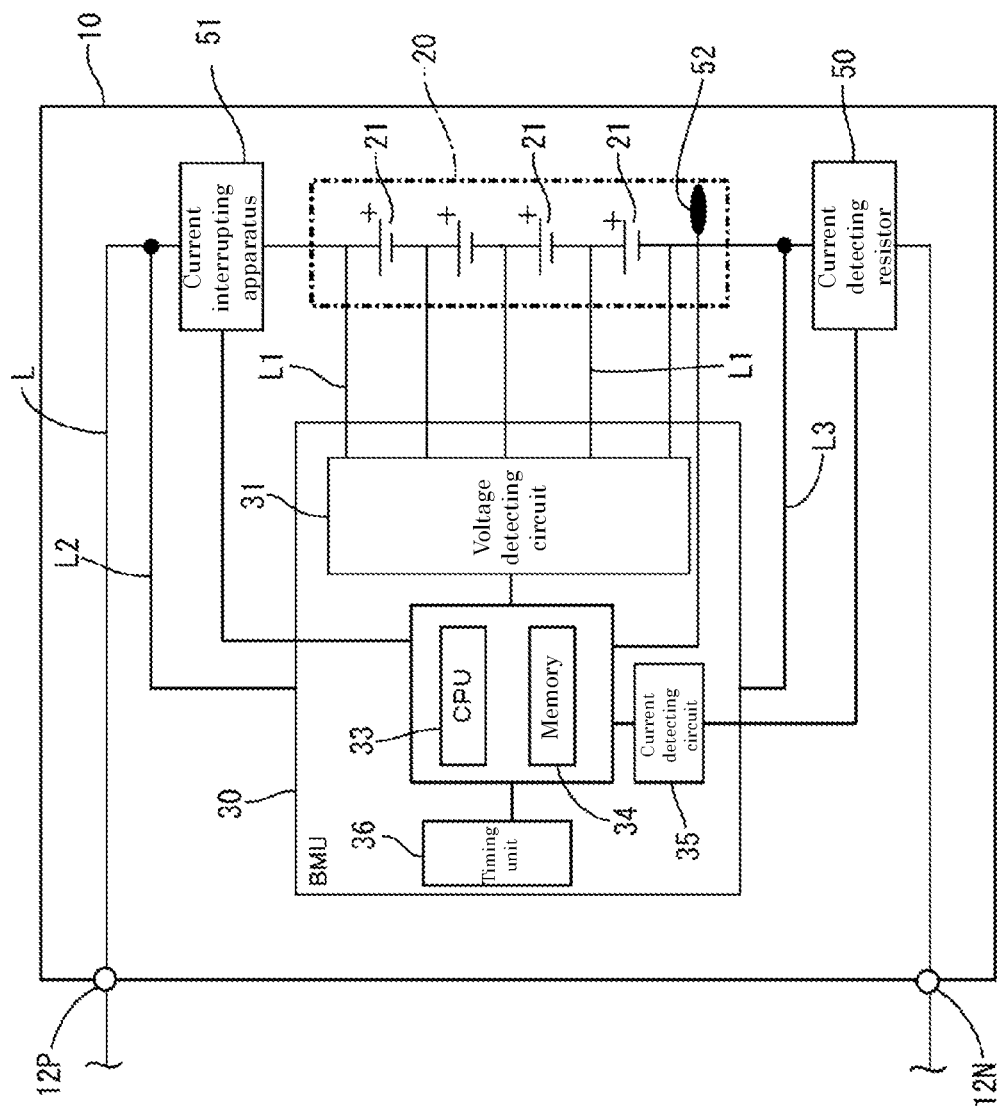
FIG. 2 is a block diagram of an energy storage apparatus.

As illustrated in FIG. 2, the energy storage apparatus 10 includes an assembled battery 20, a battery managing apparatus (an example of the "managing apparatus", hereinafter referred to as "BMU") 30, a current detecting resistor 50, a current interrupting apparatus 51, and a temperature sensor (an example of the "measurement unit") 52.

The assembled battery 20, the current detecting resistor 50, and the current interrupting apparatus 51 are connected in series through a conduction path L. A positive electrode side of the assembled battery 20 is connected to a positive electrode terminal 12P through the current interrupting apparatus 51, and a negative electrode side is connected to a negative electrode terminal 12N through the current detecting resistor 50.

The assembled battery 20 is constructed by connecting a plurality of (in the first embodiment, four) energy storage devices 21 in which a negative active material of a graphite material and a positive active material of an iron phosphate material such as iron phosphate lithium are used to each other in series. The positive active material may be a two phase reaction type active material. The positive active material is a material represented by a general formula LiMPO4. M may be any one of Fe, Mn, Cr, Co, Ni, Mo, Mg, but is not limited thereto. Specifically, the negative active material is any one of graphite, easily graphitizable carbon, hardly graphitizable carbon, and the like.

The current detecting resistor 50 is a resistor that detects the current at the conduction path L, and outputs the voltage between both ends of the current detecting resistor 50 to the BMU 30.

For example, the current interrupting apparatus 51 is constructed with a semiconductor switch such as an N-channel FET or a relay. The current interrupting apparatus 51 is operated in response to a drive command from the BMU 30, and interrupts the conduction between the assembled battery 20 and the positive electrode terminal 12P.

The temperature sensor 52 is a contact type or non-contact type, and is connected to the BMU 30. The temperature sensor 52 measures the temperature [° C.] of the assembled battery 20 and outputs it to the BMU 30.

The BMU 30 includes a voltage detecting circuit 31, a CPU (an example of the "controller") 33 that is a central processing unit, a memory 34, a current detecting circuit 35, and a timing unit 36. The BMU 30 is connected to the conduction path L through a power path L2 connected between the positive electrode terminal 12P and the current interrupting apparatus 51 and a power line L3 connected between the assembled battery 20 and the current detecting resistor 50, thereby receiving the supply of the power from the assembled battery 20.

The power is not supplied to the BMU 30 when the current interrupting apparatus 51 interrupts the conduction between the assembled battery 20 and the positive electrode terminal 12P.

In the photovoltaic power generating system PS of the first embodiment, in order to prevent discharge of the assembled battery 20 in the energy storage apparatus 10, the current interrupting apparatus 51 interrupts the conduction through the BMU 30 in association with power-off of the photovoltaic power generating system PS. When the photovoltaic power generating system PS is powered on, the current interrupting apparatus 51 is switched to the conduction state through the BMU 30 using the power supplied from the power conditioner PC.

The voltage detecting circuit 31 is connected to both ends of each energy storage device 21 through a plurality (in the first embodiment, five) of cell voltage detecting lines L1, and a cell voltage of each energy storage device 21 and a battery voltage of the assembled battery 20 are output to the CPU 33.

For example, the memory 34 is a nonvolatile memory such as a flash memory and an EEPROM. The memory 34 stores various programs managing each energy storage device 21 or the assembled battery 20, data required to execute the various programs (for example, an OCV-SOC correlation or an initial actual capacity of the assembled battery 20), and the like.

The voltage at both the ends of the current detecting resistor 50 is input to the current detecting circuit 35, and current passed through the conduction path L is calculated and output to the CPU 33 based on the voltage at both the ends of the current detecting resistor 50 and a resistance value of the current detecting resistor 50.

The timing unit 36 measures time. The timing unit 36 measures the time of temperature measurement by the temperature sensor 52 and a time difference between the temperature measurements, and outputs the time and the time difference to the CPU 33. The timing unit 36 is connected to a backup power supply (not illustrated) including a capacitor, and the time can continuously be measured even if the current interrupting apparatus 51 interrupts the conduction between the assembled battery 20 and the positive electrode terminal 12P.

The CPU 33 monitors and controls each unit based on the received various pieces of information and the program read from the memory 34.

Generally, in the assembled battery, the full charge capacity is decreased by cycle degradation due to repetition of charge and discharge and time degradation due to the elapsed time after manufacturing. The full charge capacity means a capacity that can be taken out from the fully charged state of the assembled battery. In addition, it can be illustrated that An SEI (Solid Electrolyte Interface) film formed on a negative electrode of a lithium ion secondary battery is grown and thickened over time after manufacturing can be illustrated as a factor causing the time degradation.

Generally an estimation method using a root rule can be adopted for the time degradation. The root rule is a rule that a decrease amount (degradation amount) Q of the full charge capacity is proportional to a route (for example, a square root) of the elapsed time Ti that is the elapsed time after the battery is left.

Figure 3:
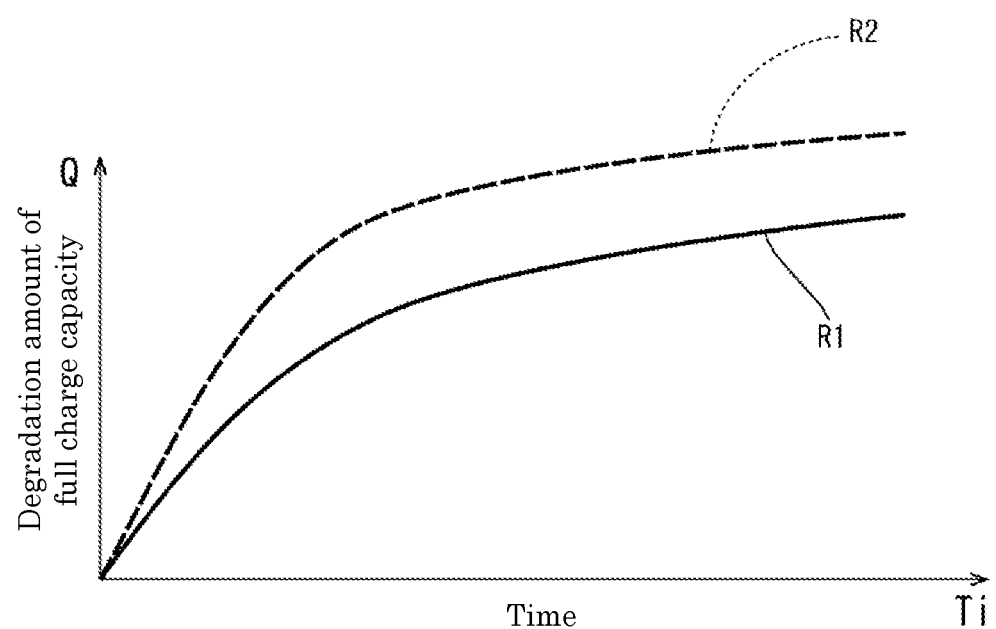
FIG. 3 is a graph illustrating a temporal transition of a degradation amount of a full charge capacity

FIG. 3 illustrates a temporal transition of a degradation amount Q of the full charge capacity when the assembled battery 20 is powered off and left after the assembled battery 20 is energized.

FIG. 3 is a Q-Ti correlation graph in which a vertical axis is the degradation amount Q of the full charge capacity and a horizontal axis is the elapsed time Ti after the battery is left. Capacity change curves R1 and R2 representing the temporal transition of the degradation amount Q of the full charge capacity are root curves with respect to the elapsed time Ti. The solid line R1 in FIG. 3 is set such that the battery temperature is lower than that of the broken line R2. As illustrated in FIG. 3, the degradation amount Q increases with increasing battery temperature.

In the Q-Ti correlation graph, the horizontal axis is represented as a root of the elapsed time Ti after the battery is left. As illustrated in the Q-√Ti correlation graph of FIG. 4, the degradation amount Q of the full charge capacity and the elapsed time Ti after the battery is left have a proportional relationship, and the transition of the full charge capacity of the assembled battery 20 is expressed as a linear capacity change straight line (degradation rate coefficient) k.

At this point, the degradation rate coefficient k can be given by the following equation (1) that is a reaction velocity equation of Arrhenius, where Ea is activation energy, A is a frequency factor, R is a gas constant, and Te is an absolute temperature.

[Mathematical formula 1]

$$k = A\exp\frac{-Ea}{RTe} \quad (1)$$

The following equation is obtained by taking a logarithm of the equation (1).

[Mathematical formula 2]

$$\ln k = \ln A - \frac{Ea}{R} \times \frac{1}{Te} \quad (2)$$

Figure 5:
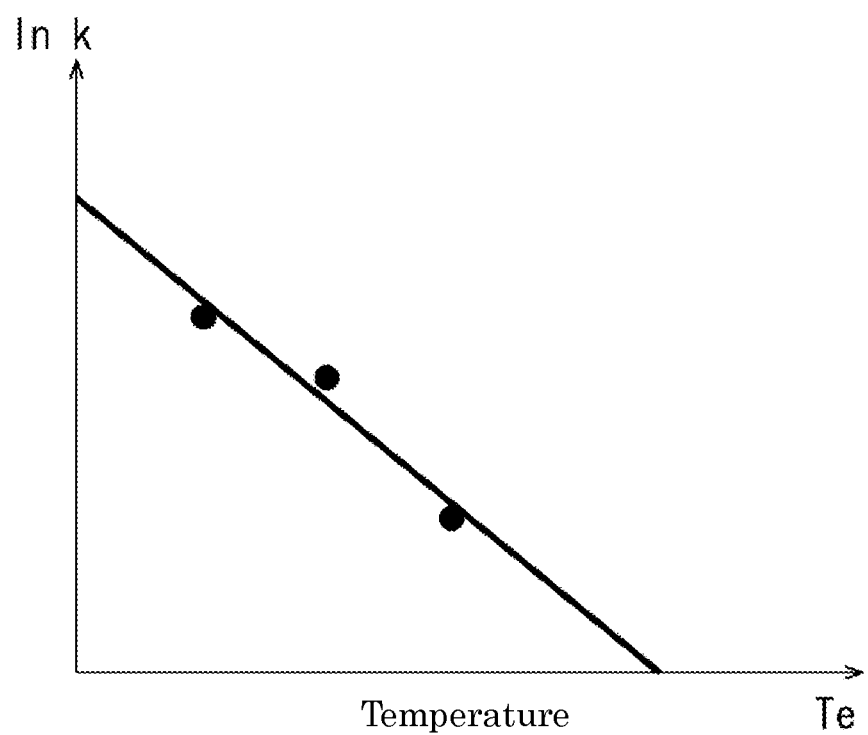
FIG. 5 is a graph illustrating a correlation between a natural logarithm of a degradation rate coefficient and a battery temperature.

As illustrated in FIG. 5, when an intercept ln A and a slope Ea/R are experimentally obtained on assumption that the Arrhenius' reaction rate equation is a linear equation, an ln k-Te correlation graph in which the vertical axis is a degradation rate ln k and the horizontal axis is an absolute temperature Te can be expressed by the following equation (2).

[Mathematical formula 3]

$$k = f(Te) \quad (2)$$

Figure 6:
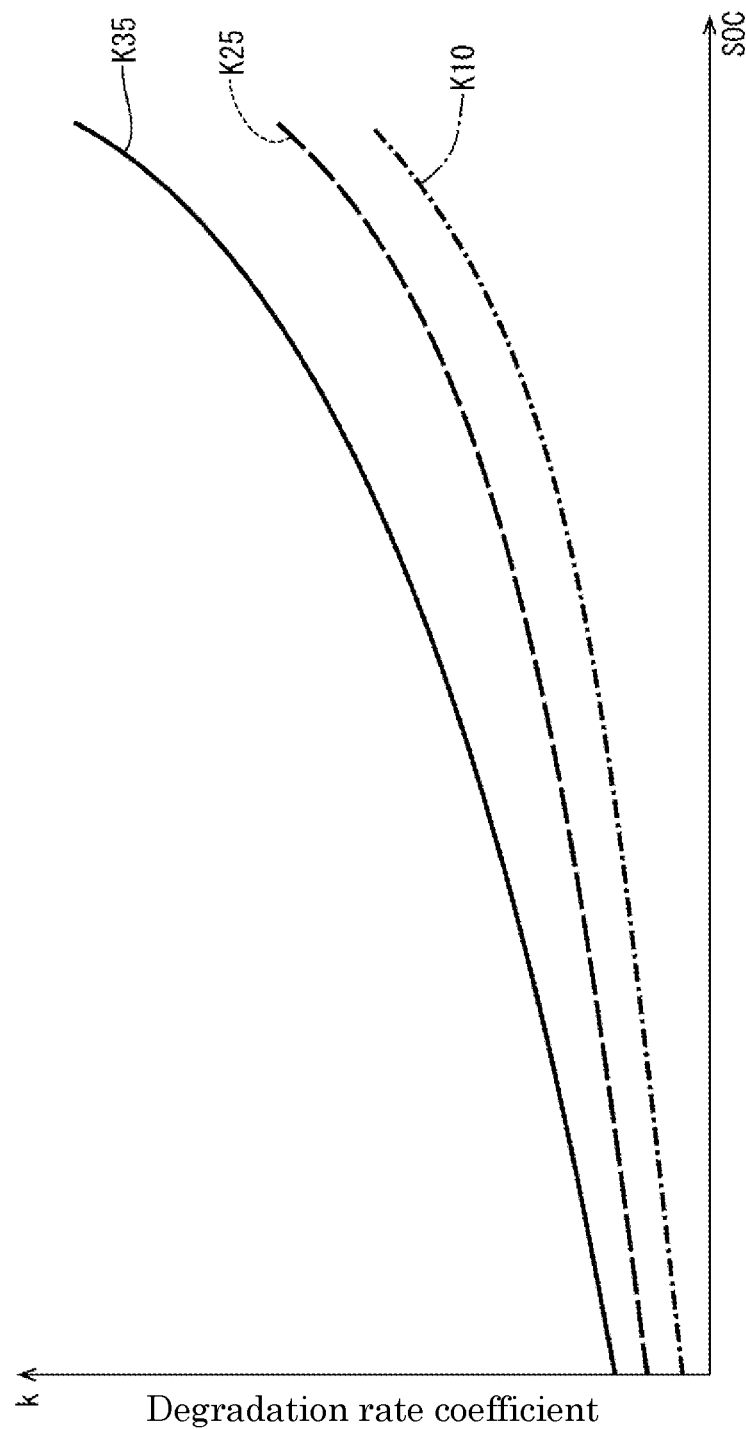
FIG. 6 is a graph illustrating a correlation between the degradation rate coefficient and a state of charge (SOC).

As illustrated in FIG. 6, when the elapsed time is identical, generally the degradation rate coefficient k tends to decrease with decreasing SOC (state of charge [%]: a ratio of a residual capacity to the full charge capacity)) of the assembled battery. FIG. 6 is a k-SOC correlation graph in which the vertical axis is the degradation rate coefficient k and the horizontal axis is the SOC. A solid line k35 indicates the relationship between the degradation rate coefficient and the SOC at the battery temperature of 35 [° C.]. A broken line k25 indicates the relationship between the degradation rate coefficient and the SOC at the battery temperature of 25 [° C.], and an alternate long and short dashed line k10 indicates the relationship between the degradation rate coefficient and the SOC at the battery temperature of 10 [° C.].

Figure 4:
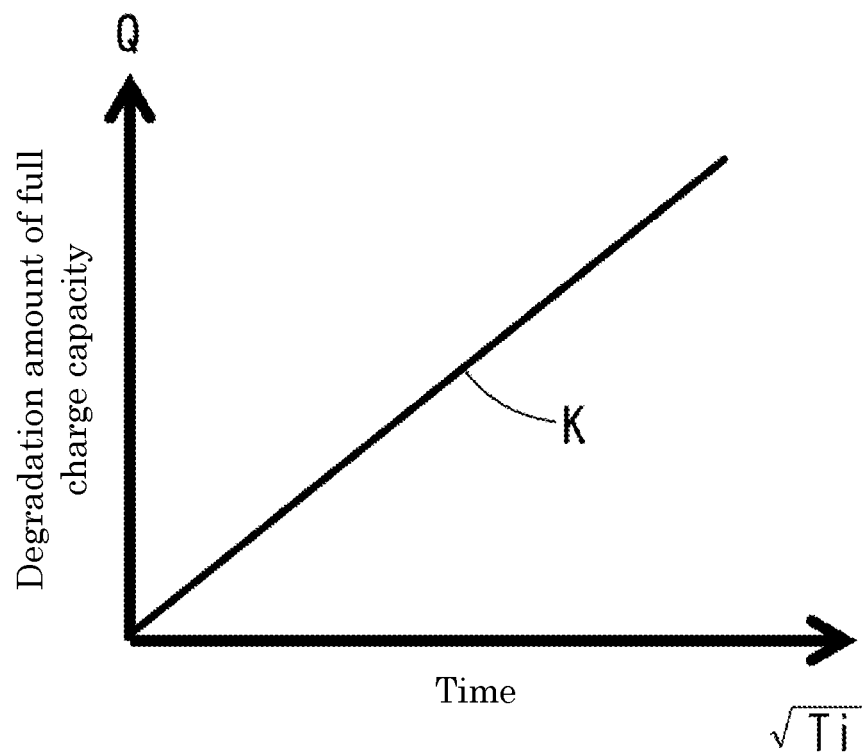
FIG. 4 is a graph illustrating a correlation between the degradation amount of the full charge capacity and a route of time.
Figure 7:
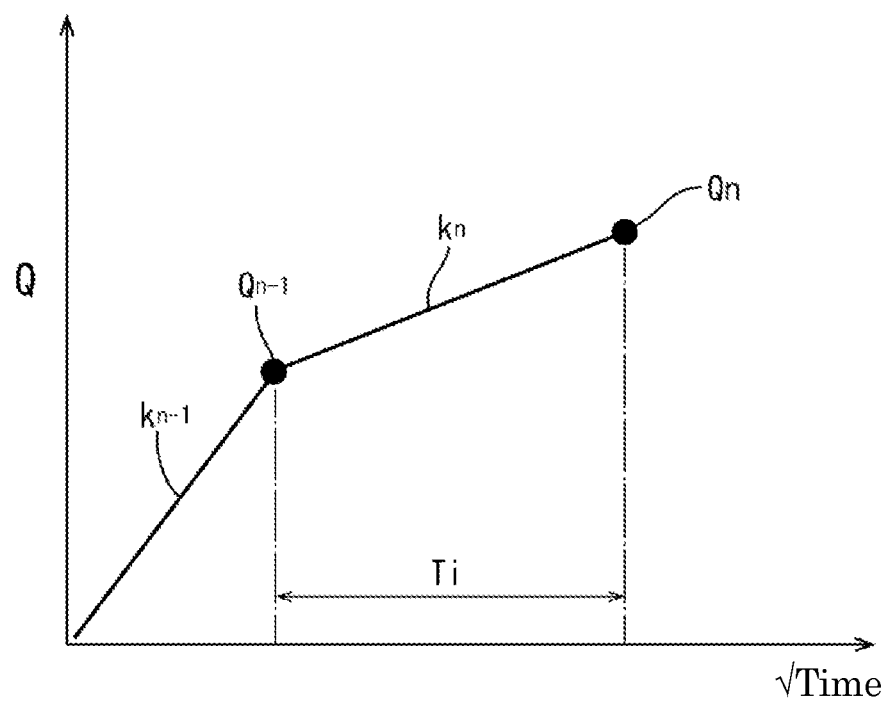
FIG. 7 is a graph illustrating the degradation amount of the full charge capacity over an elapsed time.

Based on the equation (2) corresponding to the SOC after the temperature change of the assembled battery 20, the degradation rate coefficient k is obtained from the battery temperatures before and after the temperature change of the assembled battery 20. As illustrated in FIG. 7, the degradation amount of the assembled battery 20 can be estimated in the elapsed time using the following equation (3). Where Ti is the elapsed time after the assembled battery 20 is left since the previous measurement, Qn is the degradation amount of the assembled battery 20 at an end point of the elapsed time Ti (the degradation amount of the assembled battery 20 at a current time), Qn−1 is the degradation amount of the assembled battery 20 at a start point of the elapsed time Ti (the degradation amount of the assembled battery 20 when the degradation amount is estimated at a previous time), and kn is the degradation rate coefficient (k=f(Te)) at the current measurement. FIG. 4 is a correlation graph of a Q-√ time in which the vertical axis is the degradation amount Q of the fully charged capacity and the horizontal axis is the time, and kn−1 is the degradation rate coefficient at the previous measurement.

[Mathematical formula 4]

$$Q_n = Q_{n-1} + k_n \times \sqrt{Ti} \quad (3)$$

That is, the current degradation amount Qn of the assembled battery 20 can be estimated by adding the current degradation amount in the elapsed time Ti to the previous degradation amount Qn−1. The full charge capacity of the assembled battery 20 at the current time can be calculated by dividing a time degradation amount calculated by equation (3) and a separately-obtained cycle degradation amount from the initial battery capacity.

Specifically, the CPU 33 perform time degradation estimation processing of estimating a total degradation amount ΣQ in the time degradation of the assembled battery 20 based on the temperature constantly or periodically input from temperature sensor 52 and timing unit 36, the elapsed time from the previous battery temperature measurement, and the SOC.

Figure 8:
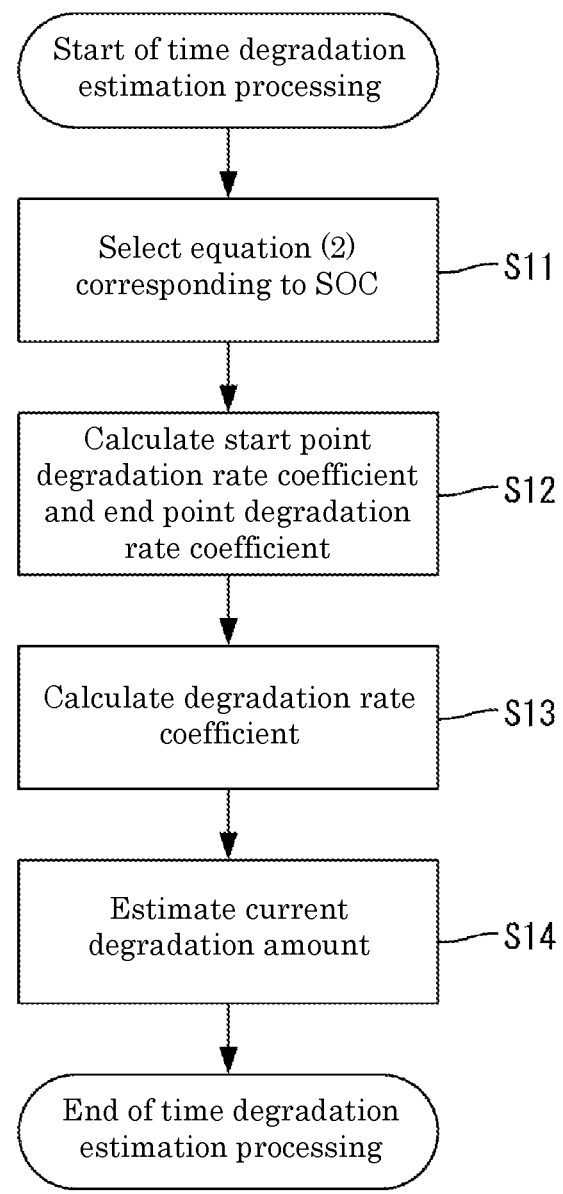
FIG. 8 is a flowchart of time degradation estimation processing in a first embodiment.

The time degradation estimation processing will be described below with reference to a flowchart in FIG. 8.

In the energy storage apparatus 10, the battery temperature of the assembled battery 20 and the elapsed time Ti from the previous battery temperature measurement are constantly or periodically input from the temperature sensor 52 and the timing unit 36 to the CPU 33, and the battery voltage at the previous measurement time of the previous battery temperature and the battery voltage at the current measurement time of the battery temperature are input from the voltage detecting circuit 31 to the CPU 33.

The time degradation estimation processing is performed based on the elapsed time Ti, a start point temperature Ti1 at the start point (previous measurement) of the elapsed time Ti, an end point temperature Ti2 at the end point (current measurement), and battery voltages V1, V2 at the start and end points.

The CPU 33 calculates the start point SOC and the end point SOC from the battery voltages V1, V2 at the start and the end points based on the OCV-SOC correlation stored in the memory 34, and selects the equation (2) corresponding to each calculated SOC (S11). In a range of 0% to 100% of the SOC, the equation (2) for each 10% of the SOC is previously obtained using the graph in FIG. 6 and stored in the memory 34, and the equation (2) corresponding to each SOC is selected from the memory 34 when the start point SOC and the end point SOC are calculated.

Subsequently, the start point degradation rate coefficient k1 is calculated based on the equation (2) selected by the start point SOC and the start point temperature Ti1, and the end point degradation rate coefficient k2 is calculated based on the equation (2) selected by the end point SOC and the end point temperature Ti2 (S12).

Figure 9:
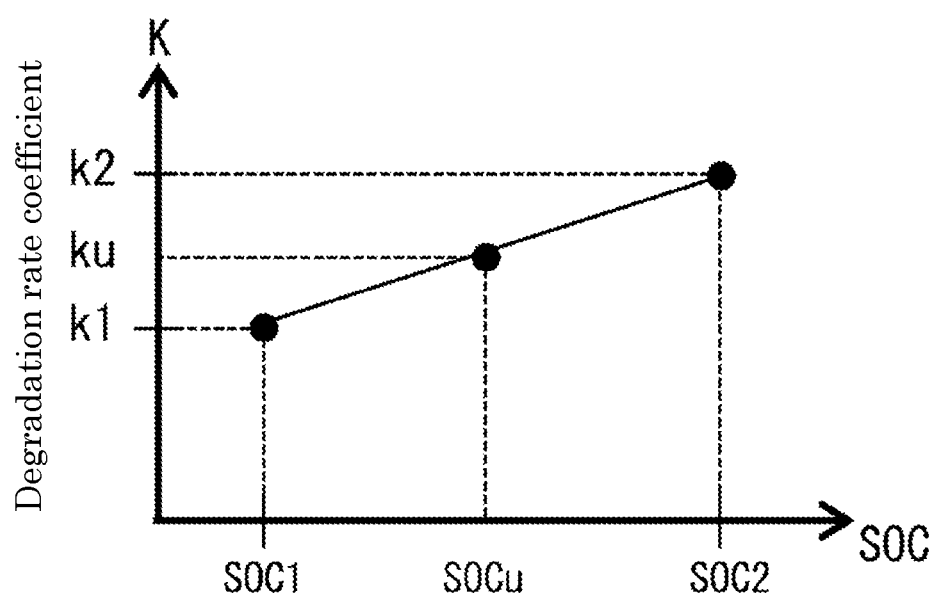
FIG. 9 is a graph illustrating the degradation rate coefficient over the elapsed time.

Based on the start point degradation rate coefficient k1 and the end point degradation rate coefficient k2, as illustrated in FIG. 9, a degradation rate coefficient ku at the elapsed time Ti is calculated by the following equation (4) (S13). Where SOC1 is the start point SOC, SOC2 is the end point SOC, and SOCu is the SOC during the elapsed time Ti.

[Mathematical formula 5]

$$ku = \frac{(k1SOC2 - k1SOCu) + (k2SOCu - k2SOC1)}{SOC2 - SOC1} \quad (4)$$
$$= \frac{k2SOC2 - k1SOC1}{SOC2 - SOC1}$$

Subsequently, when the degradation rate coefficient ku at the elapsed time Ti is calculated, the current degradation amount Qn of the assembled battery 20 is estimated by adding the current degradation amount at the elapsed time Ti to the previous degradation amount Qn−1 using the equation (3) (S14).

The full charge capacity of the assembled battery 20 can be calculated by dividing the degradation amount due to the time degradation calculated as described above and the degradation amount of the separately-calculated cycle degradation (degradation due to the repetition of the charge and discharge) from the initial battery capacity.

The full charge capacity of the assembled battery 20 can be estimated by periodically repeating the time degradation estimation processing.

In the photovoltaic power generating system PS, in order to prevent the discharge of the assembled battery 20 in the energy storage apparatus 10, the power of the photovoltaic power generating system PS is turned off, and therefore the photovoltaic power generating system PS becomes the power non-supply state in which the power of the BMU 30 in the energy storage apparatus 10 is not supplied. The BMU 30 cannot perform the time degradation estimation processing during the power non-supply state. That is, there is a concern that the capacity estimation accuracy of the full charge capacity is decreased.

Figure 10:
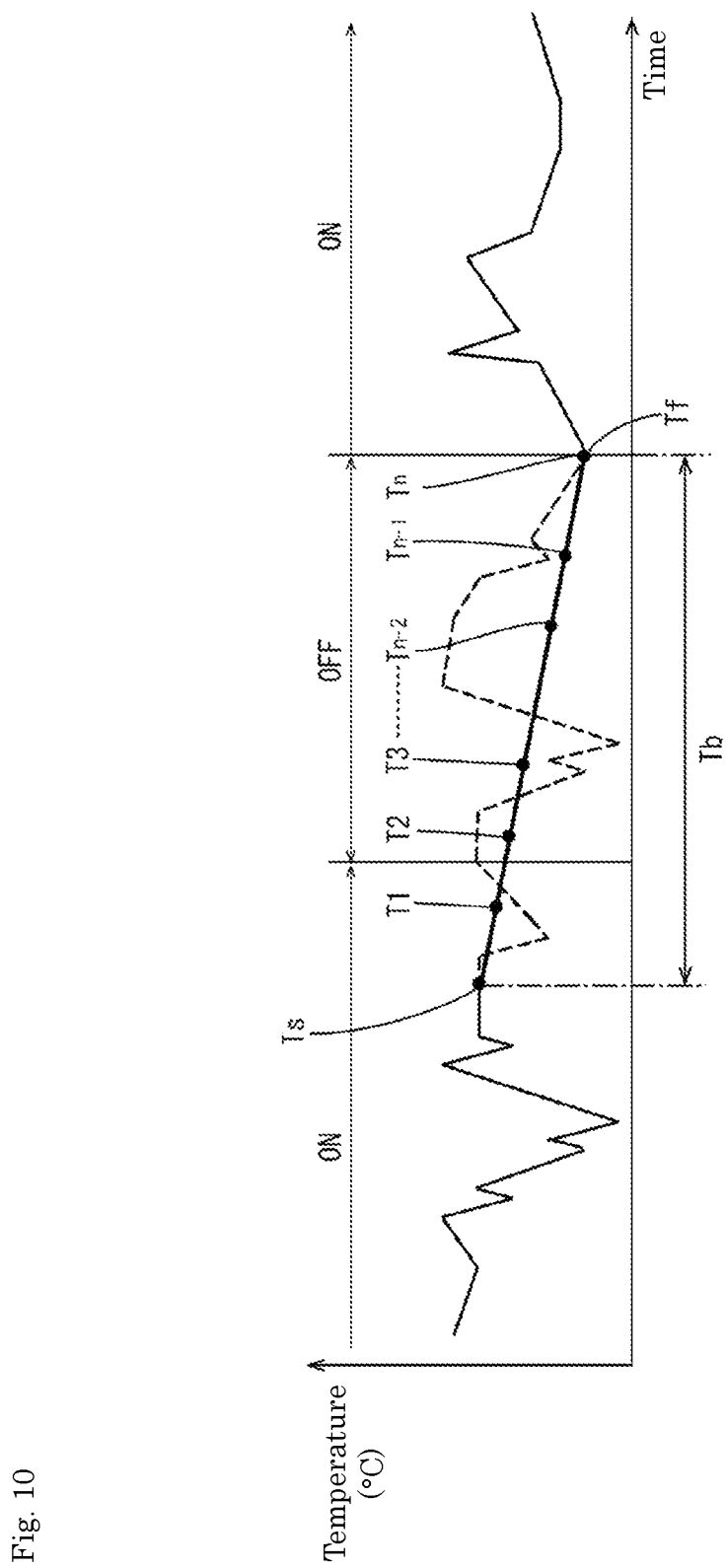
FIG. 10 is a graph illustrating the temporal transition of the battery temperature when the battery temperature in an unmeasured time is linearly complemented.

In the first embodiment, based on a final temperature (an example of the "second temperature") Tf at the time of final measurement immediately before the BMU 30 becomes the power non-supply state, an initial temperature (an example of the "first temperature") Ts at the time of the initial measurement initially performed after the power of BMU 30 is returned to become the power supply state, and an unmeasured time Tb from the time of the initial measurement to the time of the final measurement, as illustrated in FIG. 10, the battery temperature at the unmeasured time Tb is linearly complemented (an example of the "interpolation"), and the battery temperature is estimated in each predetermined sampling time to perform off-period degradation estimation processing of estimating not only the degradation amount in each predetermined sampling time but also the total degradation amount ΣQ in the time degradation during the unmeasured time Tb. Acquisition of the initial temperature Ts and the final temperature Tf corresponds to the acquisition step, and the linear interpolation of the battery temperature during the unmeasured time Tb from the initial measurement to the final measurement corresponds to the interpolation step. The estimation of the battery temperature in each predetermined sampling time corresponds to the temperature decision step, and not only the estimation of the degradation amount in each predetermined sampling time but also the total degradation amount ΣQ in the time degradation during the unmeasured time Tb corresponds to the estimation step.

Figure 11:
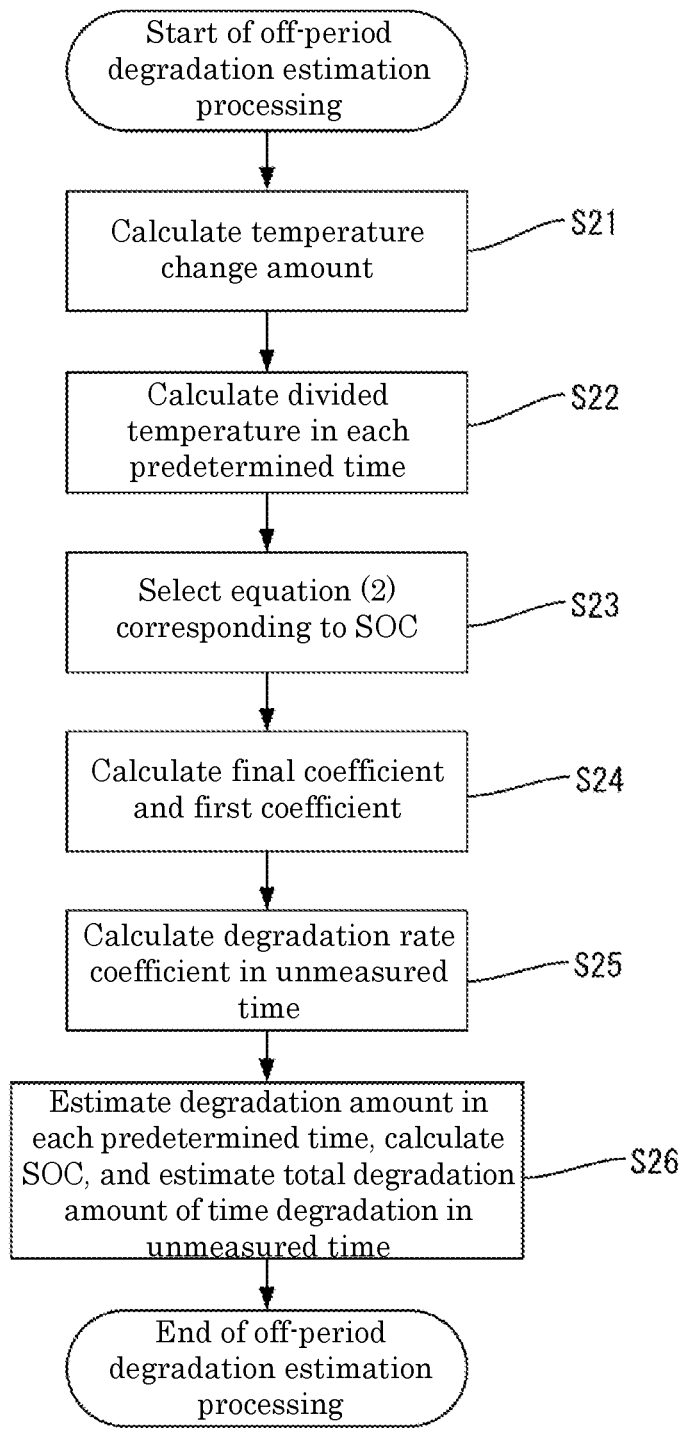
FIG. 11 is a flowchart of off-period degradation estimation processing in the first embodiment.

The off-period degradation estimation processing will be described below with reference to a flowchart in FIG. 11.

In the off-period degradation estimation processing, the CPU 33 interpolates the battery temperature during the unmeasured time Tb using a straight line on the assumption that the battery temperature between the final temperature Tf and the initial temperature Ts in the unmeasured time Tb changes linearly, and calculates a temperature change amount Tc per unit time in the unmeasured time Tb (S21).

Subsequently, the CPU 33 divides the unmeasured time Tb into each predetermined sampling time, and calculates divided temperatures (Tu1, Tu2, . . . , Tun) that are the battery temperatures at each predetermined sampling time (Tb1, Tb2, . . . , Tbn) based on the temperature change amount Tc per unit time (S22). At this point, Tb1 represents a first predetermined time obtained by dividing the predetermined time, and Tbn represents an nth predetermined time obtained by dividing the predetermined time.

The CPU 33 calculates the SOC during the unmeasured time Tb based on the battery voltage at the measurement time of the initial temperature Ts and the OCV-SOC correlation stored in the memory 34, and selects the equation (2) corresponding to the calculated SOC (S23).

The CPU 33 calculates a final coefficient kf that is a degradation rate coefficient at the final time based on the selected equation (2) and the final temperature Tf, and calculates a first coefficient (the degradation rate coefficient at the divided temperature Tu1) k1 based on the selected equation (2) and the divided temperature Tu1 of the predetermined time Tb1 closest to the final measurement time in the unmeasured time Tb (S24).

Subsequently, based on the final coefficient kf and the first coefficient k1, the CPU 33 calculates the degradation rate coefficient kf1 in the unmeasured time Tb using the equation (4) (S25). Note that f of the degradation rate coefficient kf1 represents f of the final coefficient kf and 1 of kf1 represents 1 of the first coefficient k1.

Based on the degradation rate coefficient kf1 in the unmeasured time Tb, the degradation amount Q1 in the time degradation of the assembled battery 20 is calculated at the division temperature Tu1 closest to the final measurement in the unmeasured time Tb using the equation (3). Consequently, the first degradation amount Q1 obtained by dividing the unmeasured time Tb into each predetermined sampling time can be obtained.

Based on the degradation amount Q1, the degradation amount of the full charge capacity is updated to recalculate the SOC during the unmeasured time Tb, and the equation (2) corresponding to the recalculated SOC is selected (S26).

Subsequently, a second coefficient (degradation rate coefficient at divided temperature Tu2) k2 is calculated based on the equation (2) selected in S26 and the divided temperature Tu2 of the predetermined time Tb2, and a degradation rate coefficient k12 in the unmeasured time Tb is calculated based on the first coefficient k1 and the second coefficient k2. A degradation amount Q2 is calculated based on the degradation rate coefficient k12. The degradation amount of the full charge capacity is updated based on the degradation amount Q2, and the SOC during the unmeasured time Tb is recalculated.

In this way, the degradation amount (Q1, Q2, . . . , Qn) in each predetermined sampling time (Tb1, Tb2, . . . , Tbn) in the unmeasured time Tb is repeatedly calculated repeatedly in order to add the current degradation amount to the previous degradation amount, thereby estimating the total degradation amount $\Sigma Q$ in the time degradation of the assembled battery 20 in the unmeasured time Tb (S26).

The total degradation amount $\Sigma Q$ of the time degradation in the unmeasured time Tb is added to the degradation amount Qn of the assembled battery 20 calculated by the time degradation estimation processing, which allows the estimation of the full charge capacity of the assembled battery including the time degradation in the unmeasured time Tb.

That is, because the full charge capacity of the assembled battery 20 is estimated by adding the degradation amount during the unmeasured time Tb, which is a period when the BMU 30 is powered off, the decrease in the estimation accuracy of the full charge capacity of the assembled battery 20 can be prevented as compared to the case that the degradation amount in the period in which the BMU 30 is powered off is not estimated.

As described above, in the first embodiment, based on the final temperature Tf at the final measurement immediately before the power-off of the BMU 30 and the initial temperature Ts at the initial measurement that is initially performed after the power of the BMU 30 is returned, the divided temperature (Tu1, Tu2, . . . , Tun) in each predetermined sampling time (Tb1, Tb2, . . . , Tbn) in the unmeasured time Tb is decided by the linear interpolation. The divided degradation amount (Q1, Q2, . . . , Qn) in each predetermined sampling time is calculated based on the divided temperature, and the total degradation amount $\Sigma Q$ of the time degradation in the unmeasured time Tb is estimated, so that the decrease in the estimation accuracy of the full charge capacity of the assembled battery 20 can be prevented as compared with the case that the degradation amount in the period in which the BMU 30 is powered off is not estimated. For example, the temperature in each predetermined sampling time can be decided without previously storing an environmental temperature or acquiring temperature information from the outside.

In the first embodiment, the degradation rate coefficient (kf1, k12, k23, . . . , kns) in each predetermined sampling time (Tb1, Tb2, . . . , Tbn) is calculated based on the division temperature (Tu1, Tu2, . . . , Tun) in each predetermined sampling time (Tb1, Tb2, . . . , Tbn) in the unmeasured time Tb, and the degradation amount Q in each predetermined sampling time (Tb1, Tb2, . . . , Tbn) is estimated based on the degradation rate coefficient (kf1, k12, k23, . . . , kns). The SOC is recalculated based on the degradation amount Q in each predetermined sampling time (Tb1, Tb2, . . . , Tbn) to estimate the total degradation amount $\Sigma Q$ in the time degradation of the assembled battery 20, so that the decrease in the estimation accuracy of the total degradation amount $\Sigma Q$ of the assembled battery 20 in the unmeasured time Tb can be prevented as compared with the case that the degradation amount of the full charge capacity over the unmeasured time is collectively estimated. As a result, the estimation accuracy of the full charge capacity of the assembled battery 20 can be improved.

Second Embodiment

Figure 12:
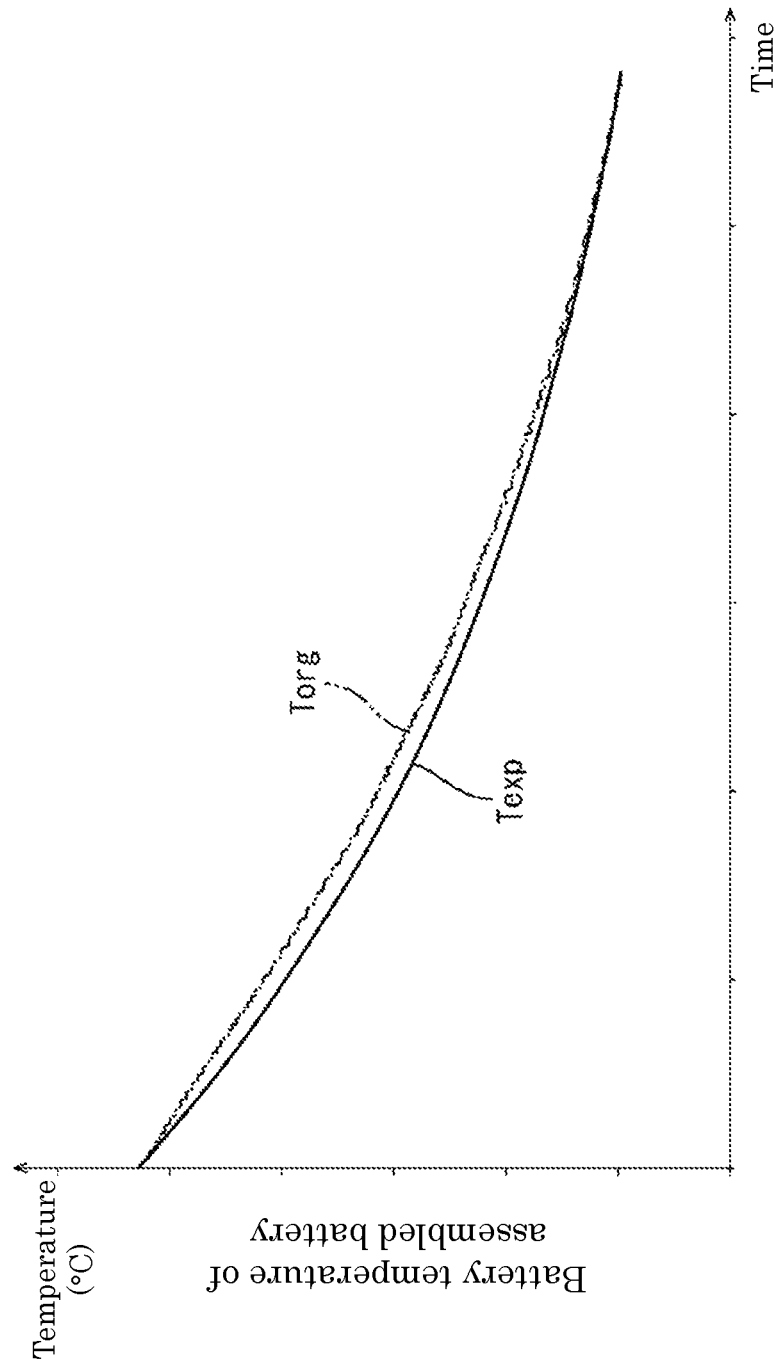
FIG. 12 is a graph illustrating the temporal transition of the battery temperature after conduction according to a second embodiment.

A second embodiment will be described below with reference to FIGS. 12 to 14.

In the second embodiment, the step of the off-period degradation estimation processing in the first embodiment is partially changed. In the second embodiment the overlapping description of the configuration, operation, and effect common to the first embodiment will be omitted. The same reference numerals are used for the same configuration as that of the first embodiment.

The inventors focused on the fact that the energized assembled battery 20 is warmed by the power, the battery temperature rises above the environmental temperature, and the battery temperature drops to the environmental temperature when the assembled battery 20 is powered off. The inventors have found that the decrease in battery temperature immediately after the power-off changes as a curve of a concave exp function instead of a straight line as illustrated in FIGS. 12 and 13.

That is, assuming that the temporal transition of the battery temperature of the assembled battery 20 in the unmeasured time Tb changes in a curved manner, the temporal transition of the battery temperature of the assembled battery 20 in the unmeasured time Tb is interpolated using an exp function model, which allows the improvement of the estimation accuracy of the degradation amount in the time degradation of the assembled battery 20 as compared with the case that the temporal transition of the battery temperature is linearly interpolated. FIG. 12 is a graph illustrating the correlation between the battery temperature and the temporal transition after the conduction, with the battery temperature, in which the vertical axis is the battery temperature and the horizontal axis is the time. In the graph of FIG. 12, a solid line T exp indicates the temporal transition of the battery temperature interpolated by the exp function model, and a broken line Torg indicates the temporal transition (true value) of the actual battery temperature.

Figure 13:
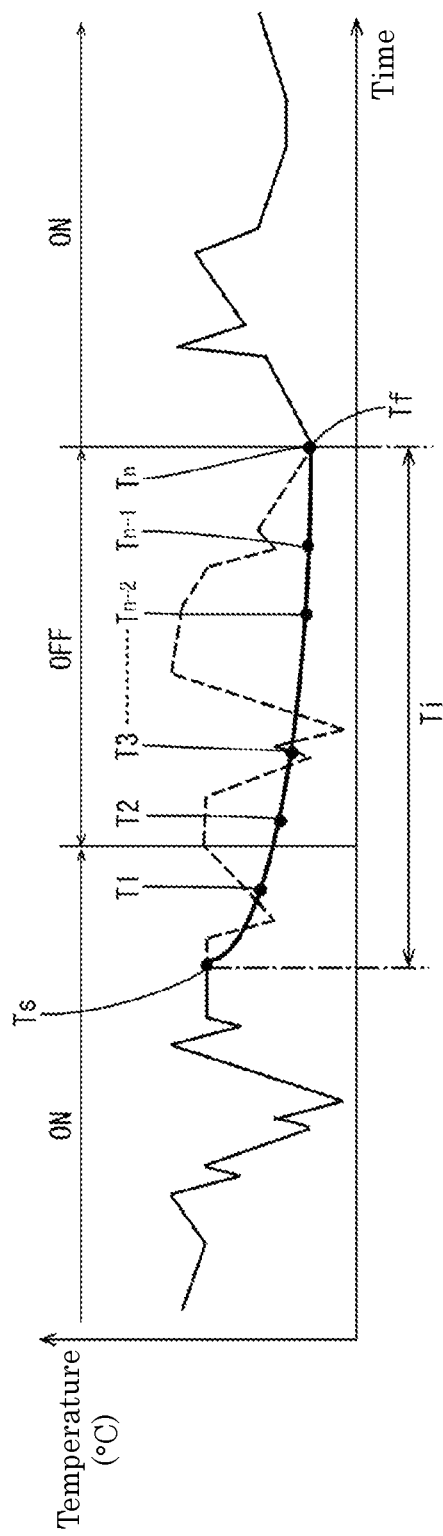
FIG. 13 is a graph illustrating the temporal transition of the battery temperature when the battery temperature in the unmeasured time is complemented using an exp function model in the second embodiment.

In the off-period degradation estimation processing of the second embodiment, using the final temperature Tf at the final measurement immediately before the power-off of the BMU 30 and the initial temperature Ts at the initial measurement first initially measured in the state in which the power of the BMU 30 is returned, the temperature transition during the unmeasured time Tb is modeled by the exp function illustrated below, and the battery temperature in the unmeasured time Tb is complemented in a concave curved manner as illustrated in FIG. 13.

The off-period degradation estimation processing of estimating not only the degradation amount (Q1, Q2, . . . , Qn) in each predetermined sampling time (Tb1, Tb2 . . . Tbn) but also the total degradation amount ΣQ in the time degradation during the unmeasured time Tb is performed by estimating the division temperature (Tu1, Tu2, . . . , Tun) in each predetermined sampling time (Tb1, Tb2, . . . , Tbn).

The off-period degradation estimation processing of the second embodiment will be described below with reference to a flowchart in FIG. 14.

In the off-period degradation estimation processing, the CPU 33 constructs the exp temperature model in which the battery temperature between the final temperature Tf and the initial temperature Ts in the unmeasured time Tb decreases in a concave manner as illustrated in FIG. 13 based on the final temperature Tf and the initial temperature Ts (S31). At this point, the exp temperature model is a temperature model that represents a temperature change with respect to the time from a time point of the power-off to the returning of the power, where y is temperature and x is time. The exp temperature model is given by the following equation (5).

[Mathematical formula 6]

$$y = A \times \exp(x) + B \quad (5)$$

For example, it is assumed that T1 and t1 are a temperature and time when the power is turned off, and that T2 and t2 are a temperature and time when the power is turned on and returned.

When the power is turned off, (y,x)=(t1,T1), and the following equation is obtained.

$$T1 = A \times \exp(t1) + B = A \times \exp(0) + B = A + B \quad \text{[Mathematical formula 7]}$$

Thus, the following equation is obtained.

$$B = T1 - A \quad \text{[Mathematical formula 8]}$$

On the other hand, when the power is turned on, (y, x)=(t2, T2), and the following equation is obtained.

$$T2 = A \times \exp(t2 - t1) + B = A \times \exp(t2 - t1) + T1 - A \quad \text{[Mathematical formula 9]}$$

Thus, the following equation is obtained.

$$A = (T2 - T1)/(\exp(t2 - t1) - 1) \quad \text{[Mathematical formula 10]}$$

That is, the exp temperature model can be given by the following equation (5-1).

[Mathematical formula 11]

$$y = \left(\frac{T2 - T1}{(\exp(t2 - t1) - 1)}\right) \times \exp(t2 - t1) + T1 - \left(\frac{T2 - T1}{(\exp(t2 - t1) - 1)}\right) \quad (5\text{-}1)$$

The CPU 33 divides the unmeasured time Tb into each predetermined sampling time, and calculates the divided temperature (T1, T2, . . . , Tn) that is the battery temperature in each predetermined sampling time (Tb1, Tb2, . . . , Tbn) using the equation (5-1) that is an exp temperature model (S32).

Figure 14:
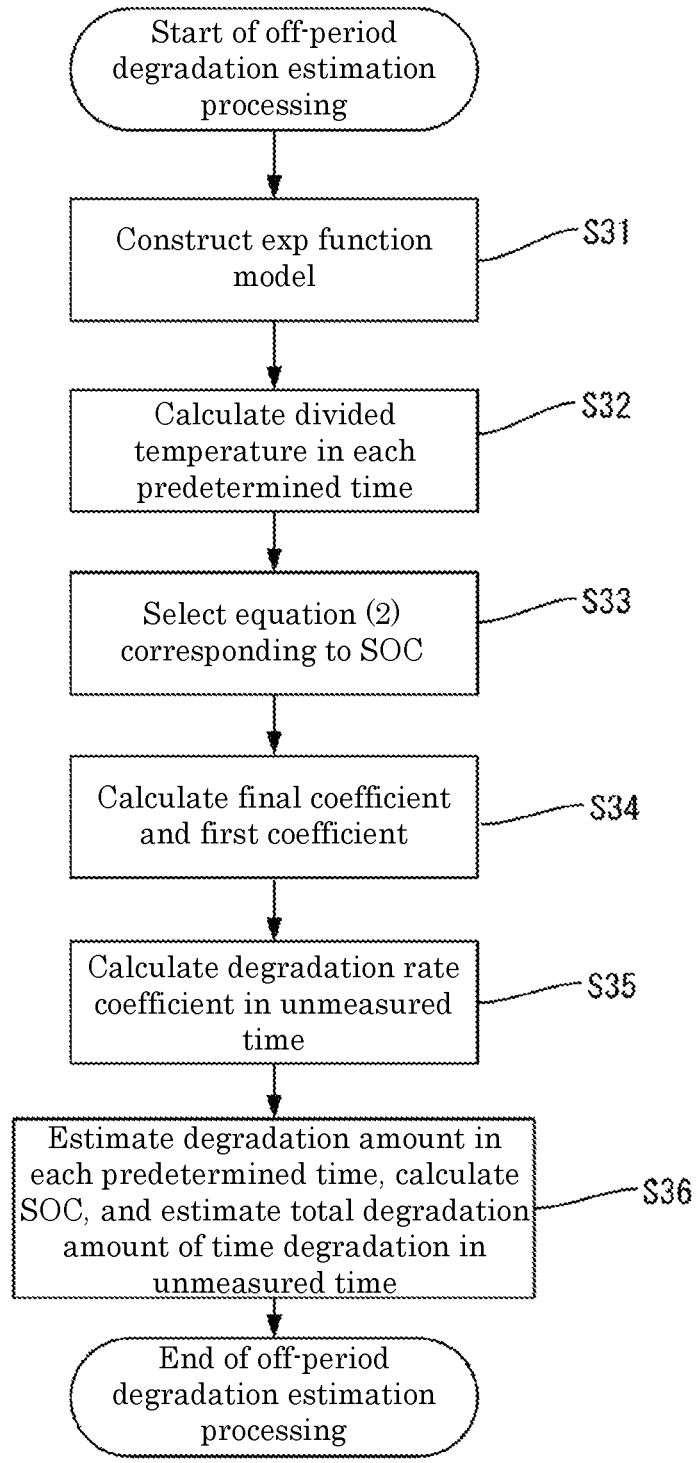
FIG. 14 is a flowchart of off-period degradation estimation processing in the second embodiment.

The CPU 33 performs S33 to S36 in FIG. 14 similarly to the first embodiment.

As described above, in the second embodiment, the temperature transition during the unmeasured time Tb is complemented by the equation (5-1) of the exp function in which the decrease in the battery temperature immediately after the power-off becomes not the straight line but the concave curve line, and the degradation amount at the division temperature in each predetermined sampling time is estimated, so that the decrease in the estimation accuracy of the full charge capacity can further be prevented as compared with the case that the unit temperature in each predetermined sampling time during the unmeasured time is linearly interpolate. The time change to the second temperature may be predicted from the temperature around the energy storage device or energy storage system, a use history, season, a place, time information, and the like, and an optimal fitting function may be selected and interpolated.

Third Embodiment

A third embodiment will be described below with reference to FIGS. 15 and 16.

In the third embodiment, the step of the off-period degradation estimation processing in the first embodiment is partially changed. In the third embodiment the overlapping description of the configuration, operation, and effect common to the first embodiment will be omitted. The same reference numerals are used for the same configuration as that of the first embodiment.

Figure 15:
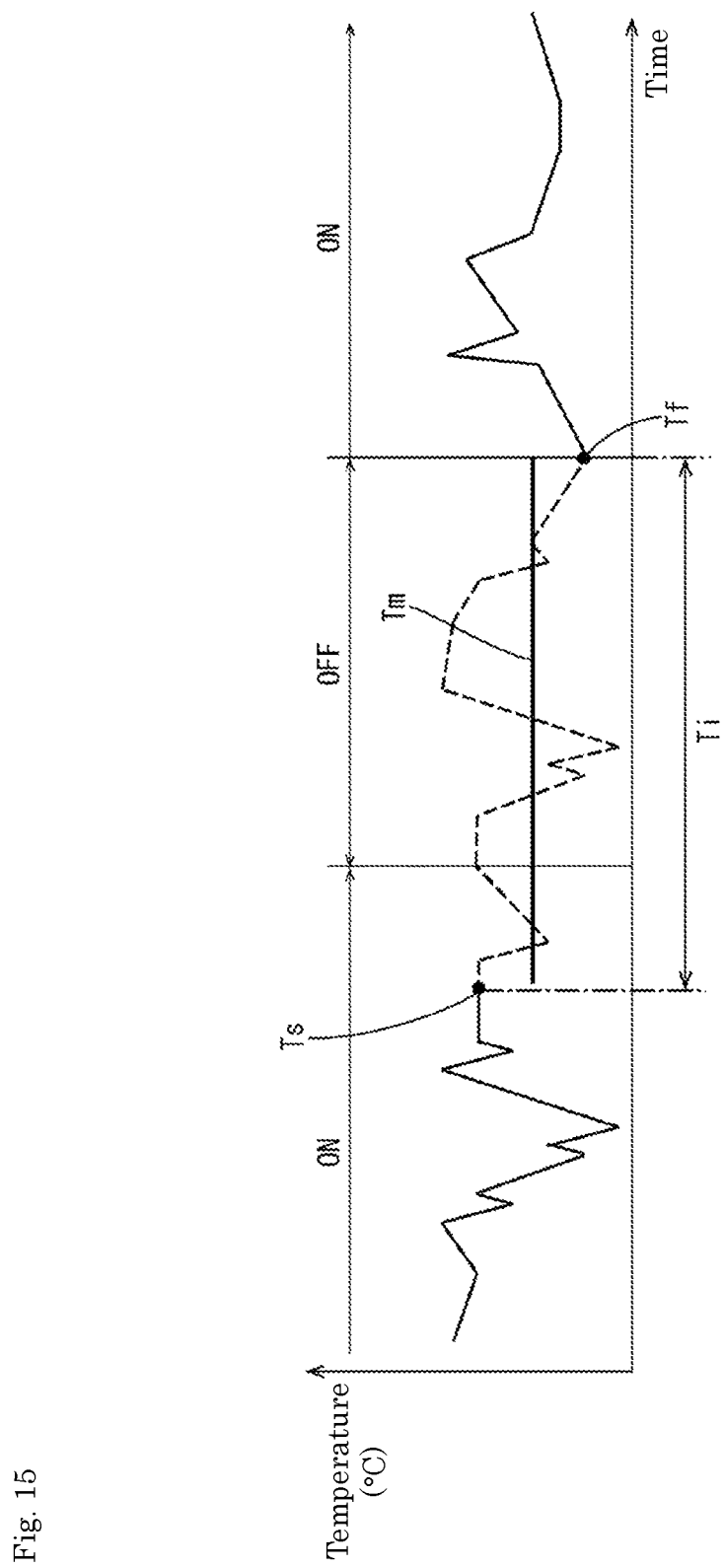
FIG. 15 is a graph illustrating the temporal transition of the battery temperature when the battery temperature in the unmeasured time is complemented by an average temperature in a third embodiment.
Figure 16:
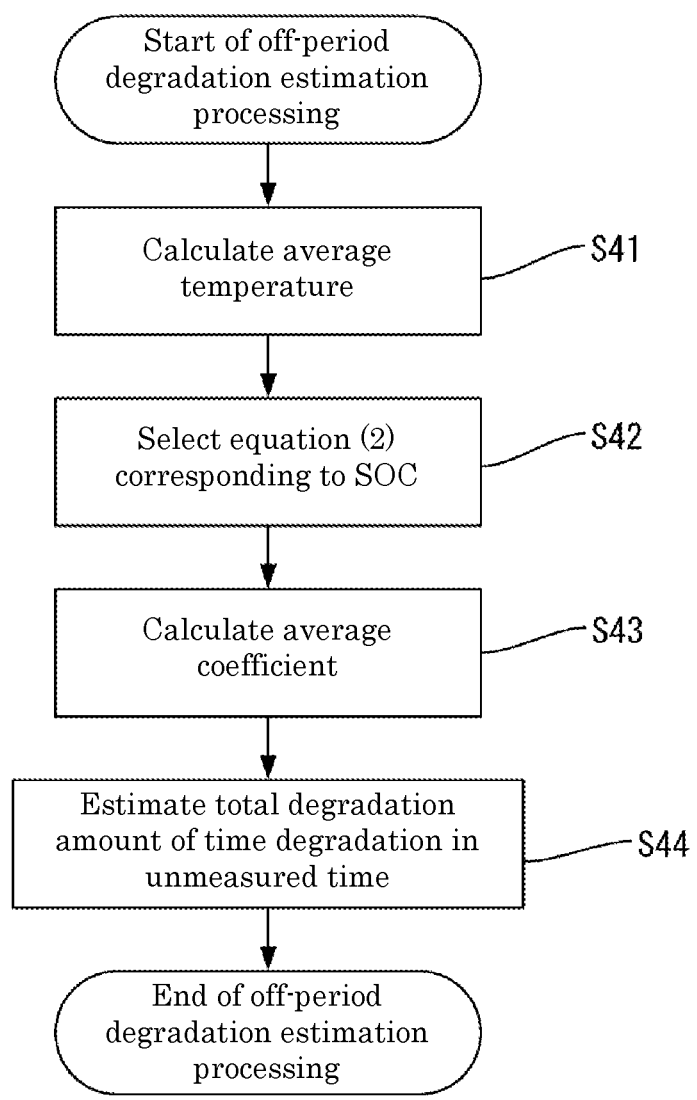
FIG. 16 is a flowchart of off-period degradation estimation processing in the third embodiment.

In the off-period degradation estimation processing of the third embodiment, as illustrated in FIG. 15, an average temperature Tm of the final temperature Tf at the final measurement immediately before the power-off of the BMU 30 and the initial temperature Ts at the initial measurement initially performed in the state in which the BMU 30 is powered on and returned is complemented as the battery temperature of the assembled battery 20 at the unmeasured time Tb. The off-period degradation estimation processing of estimating not only the degradation amount in each predetermined sampling time but also the total degradation amount in the time degradation during the unmeasured time Tb is performed by estimating the battery temperature in each predetermined sampling time.

The off-period degradation estimation processing of the third embodiment will be described below with reference to a flowchart in FIG. 16.

In the off-period degradation estimation process, the CPU 33 calculates the average temperature Tm of the final temperature Tf and the initial temperature Ts in the unmeasured time Tb (S41).

The CPU 33 calculates the SOC during the unmeasured time Tb based on the battery voltage at the measurement time of the initial temperature Ts and the OCV-SOC correlation stored in the memory 34, and selects the equation (2) corresponding to the calculated SOC (S42).

An average coefficient km that is a degradation temperature coefficient of the average temperature Tm is calculated based on the selected equation (2) and the average temperature Tm (S43).

The total degradation amount $\Sigma Q$ of the time degradation of the assembled battery 20 during the unmeasured time Tb is calculated by the equation (3) based on the average coefficient km (S44).

As described above, in the third embodiment, the degradation amount Q of the time degradation of the assembled battery 20 during the unmeasured time Tb can be calculated by the single arithmetic operation, so that the decrease in the estimation accuracy of the full charge capacity of the assembled battery 20 can be prevented as compared to the case that the degradation amount in the period in which the BMU is powered off is not estimated while a load on the CPU 33 can be reduced as compared with the off-period degradation estimation processing in which a number of arithmetic calculations is large. The final temperature and the initial temperature may be averaged (weighted average) in consideration of a weight. The weighting may be determined from the ambient temperature of the energy storage device or system, the usage history, the season, the place, the time information, and the like.

Fourth Embodiment

A fourth embodiment will be described below with reference to FIGS. 17 and 18.

In the fourth embodiment, the step of the off-period degradation estimation processing in the first embodiment is partially changed. In the fourth embodiment the overlapping description of the configuration, operation, and effect common to the first embodiment will be omitted. The same reference numerals are used for the same configuration as that of the first embodiment.

Figure 17:
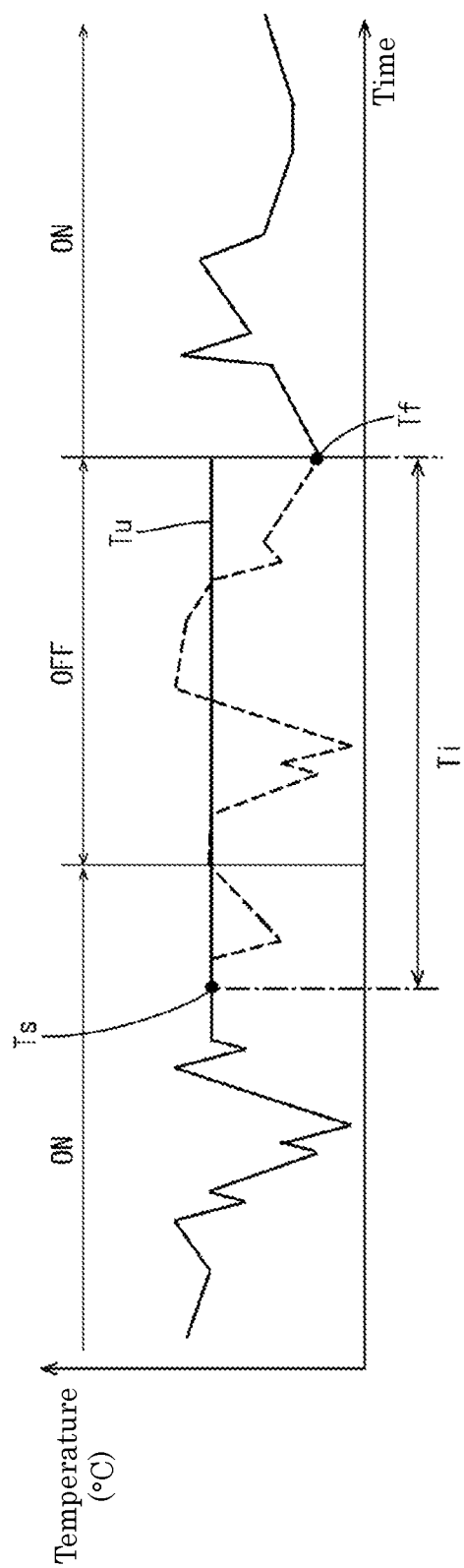
FIG. 17 is a graph illustrating the temporal transition of the battery temperature when the battery temperature in the unmeasured time is complemented by the unmeasured battery temperature in a fourth embodiment.
Figure 18:
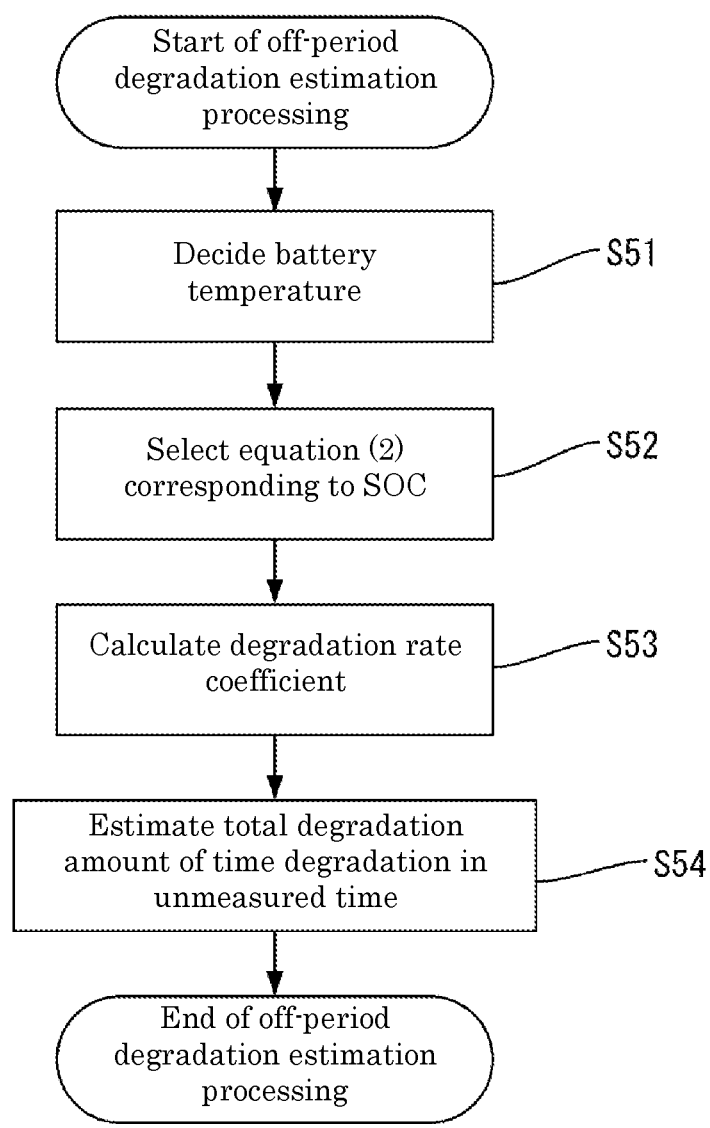
FIG. 18 is a flowchart of off-period degradation estimation processing in the fourth embodiment.

In the off-period degradation estimation processing of the fourth embodiment, as illustrated in FIG. 17, higher one of the final temperature Tf at the final measurement immediately before the power-off of the BMU 30 and the initial temperature Ts at the initial measurement initially performed in the state in which the BMU 30 is powered on and returned is complemented as the battery temperature of the assembled battery 20 at the unmeasured time Tb. The off-period degradation estimation processing of estimating not only the degradation amount in each predetermined sampling time but also the total degradation amount in the time degradation during the unmeasured time Tb is performed by estimating the battery temperature in each predetermined sampling time.

The off-period degradation estimation processing of the fourth embodiment will be described below with reference to a flowchart in FIG. 18.

In the off-period degradation estimation processing, the CPU 33 compares the final temperature Tf in the unmeasured time Tb to the initial temperature Ts in the unmeasured time Tb, and sets higher one of the final temperature Tf and the initial temperature Ts to an unmeasured battery temperature Tu in the unmeasured time Tb (S51).

The CPU 33 calculates the SOC during the unmeasured time Tb based on the battery voltage at the measurement time of the initial temperature Ts and the OCV-SOC correlation stored in the memory 34, and selects the equation (2) corresponding to the calculated SOC (S52).

Then, the degradation rate coefficient k is calculated based on the selected equation (2) and the unmeasured battery temperature Tu (S53), and the aged degradation of the assembled battery 20 during the unmeasured time Tb is obtained by the equation (3). The total amount of degradation $\Sigma Q$ is calculated (S54).

As described above, in the fourth embodiment, the degradation amount Q of the time degradation of the assembled battery 20 during the unmeasured time Tb can be calculated by the single arithmetic operation, so that the decrease in the estimation accuracy of the full charge capacity of the assembled battery 20 can be prevented as compared to the case that the degradation amount in the period in which the BMU 30 is powered off is not estimated while a load on the CPU 33 can be reduced as compared with the off-period degradation estimation processing in which the number of arithmetic calculations is large.

In the fourth embodiment, the final temperature Tf is compared to the initial temperature Ts, and the higher battery temperature of the final temperature Tf and the initial temperature Ts is set to the unmeasured battery temperature Tu during the unmeasured time Tb, so that a decrease amount of the full charge capacity can prevent from being estimated to be smaller than the actual amount.

Examples

Examples of the present invention will be described with reference to FIGS. 19 to 22.

Figure 19:
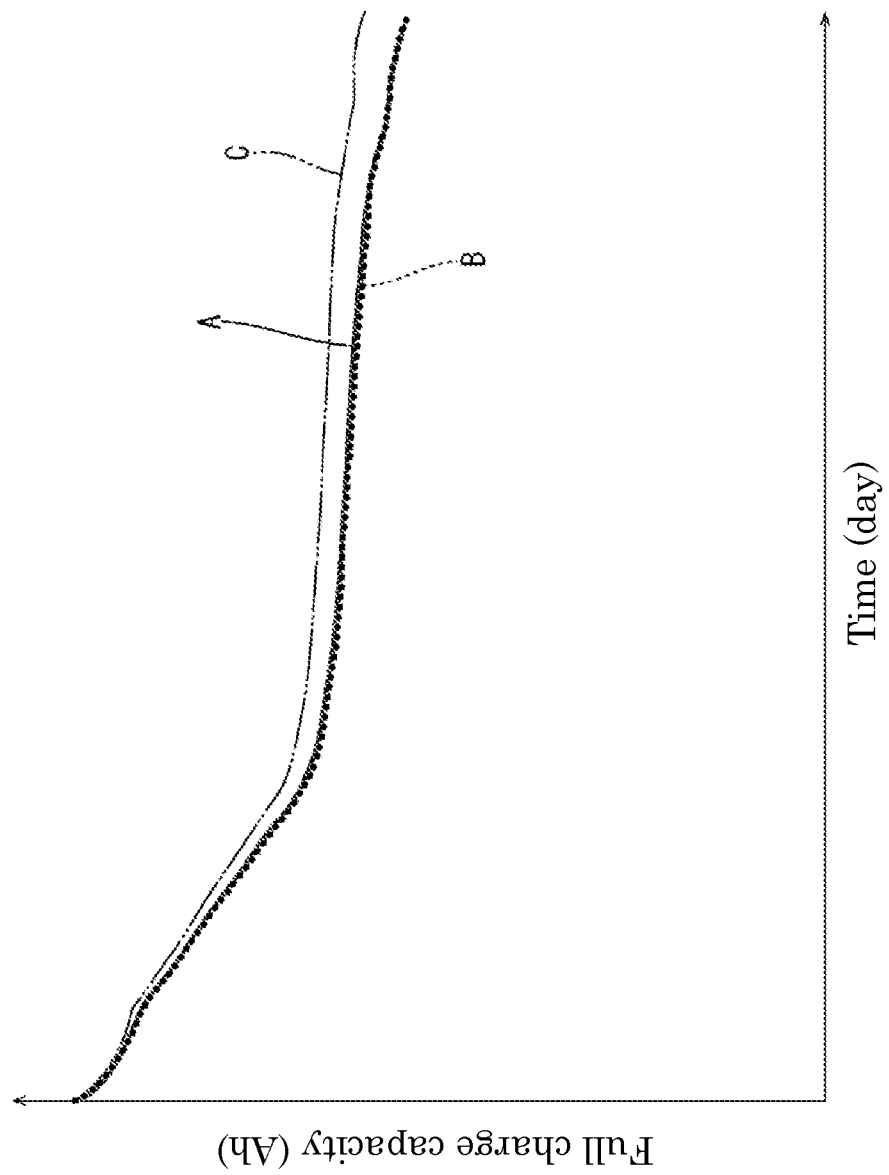
FIG. 19 is a graph illustrating the temporal transition of the full charge capacity of an assembled battery in the first embodiment.
Figure 20:
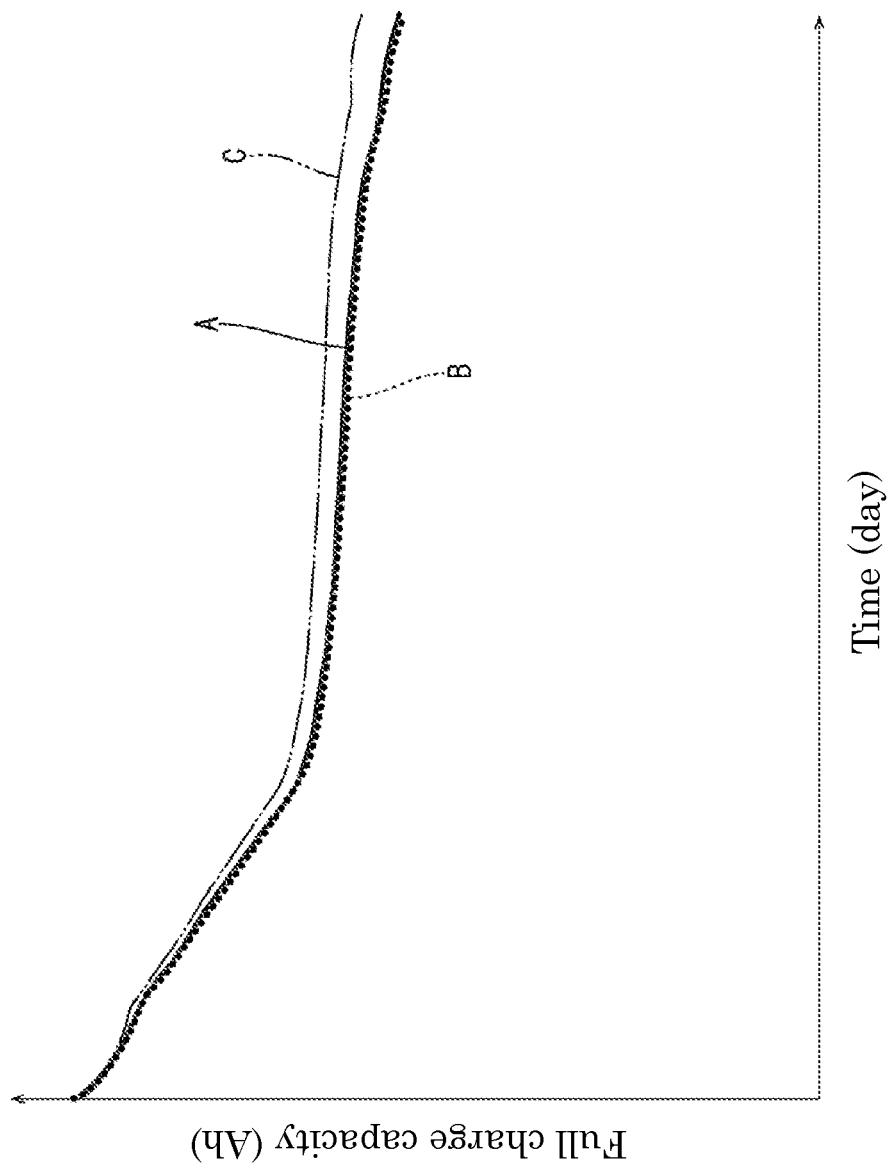
FIG. 20 is a graph illustrating the temporal transition of the full charge capacity of the assembled battery in the second embodiment.
Figure 21:
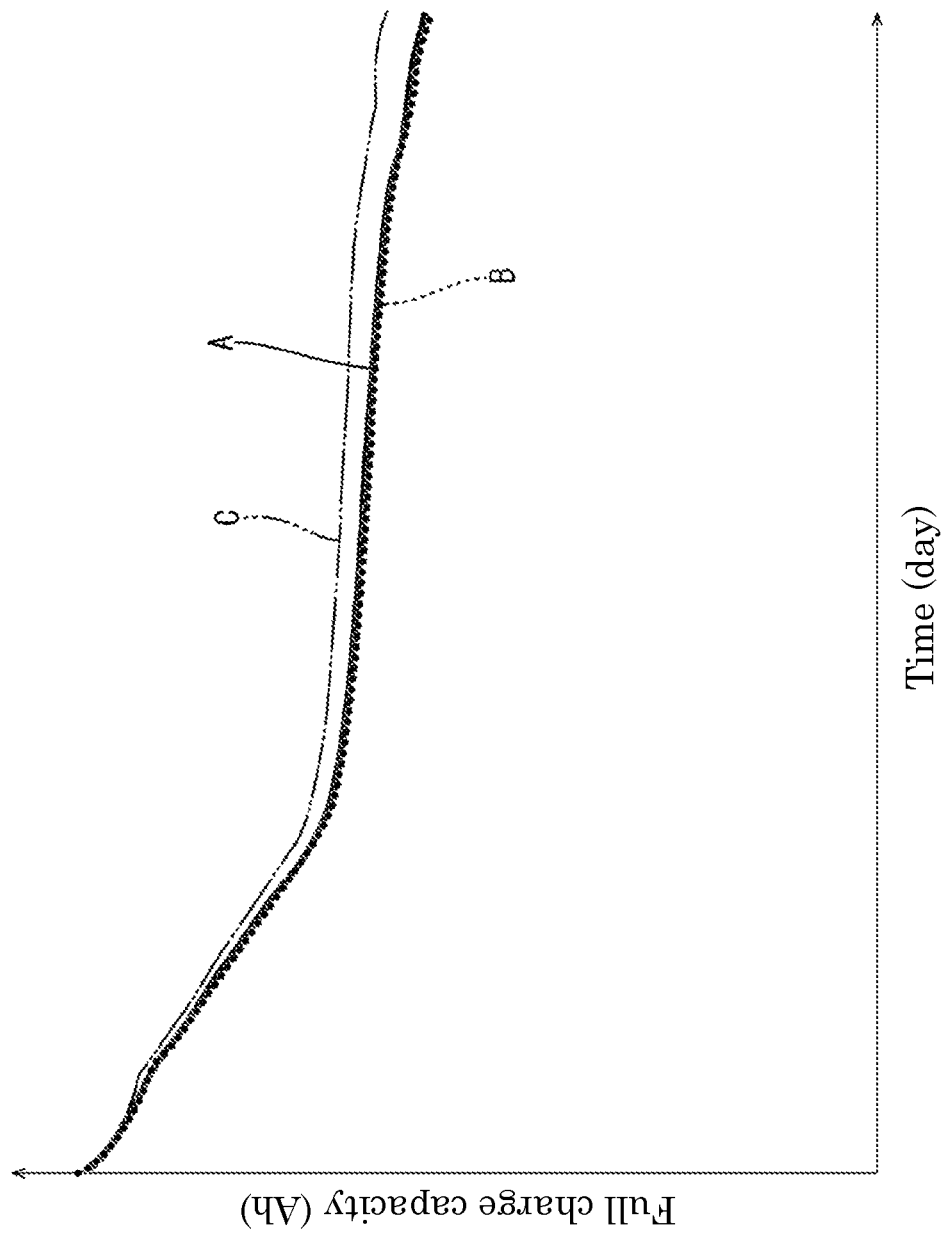
FIG. 21 is a graph illustrating the temporal transition of the full charge capacity of the assembled battery in the third embodiment.
Figure 22:
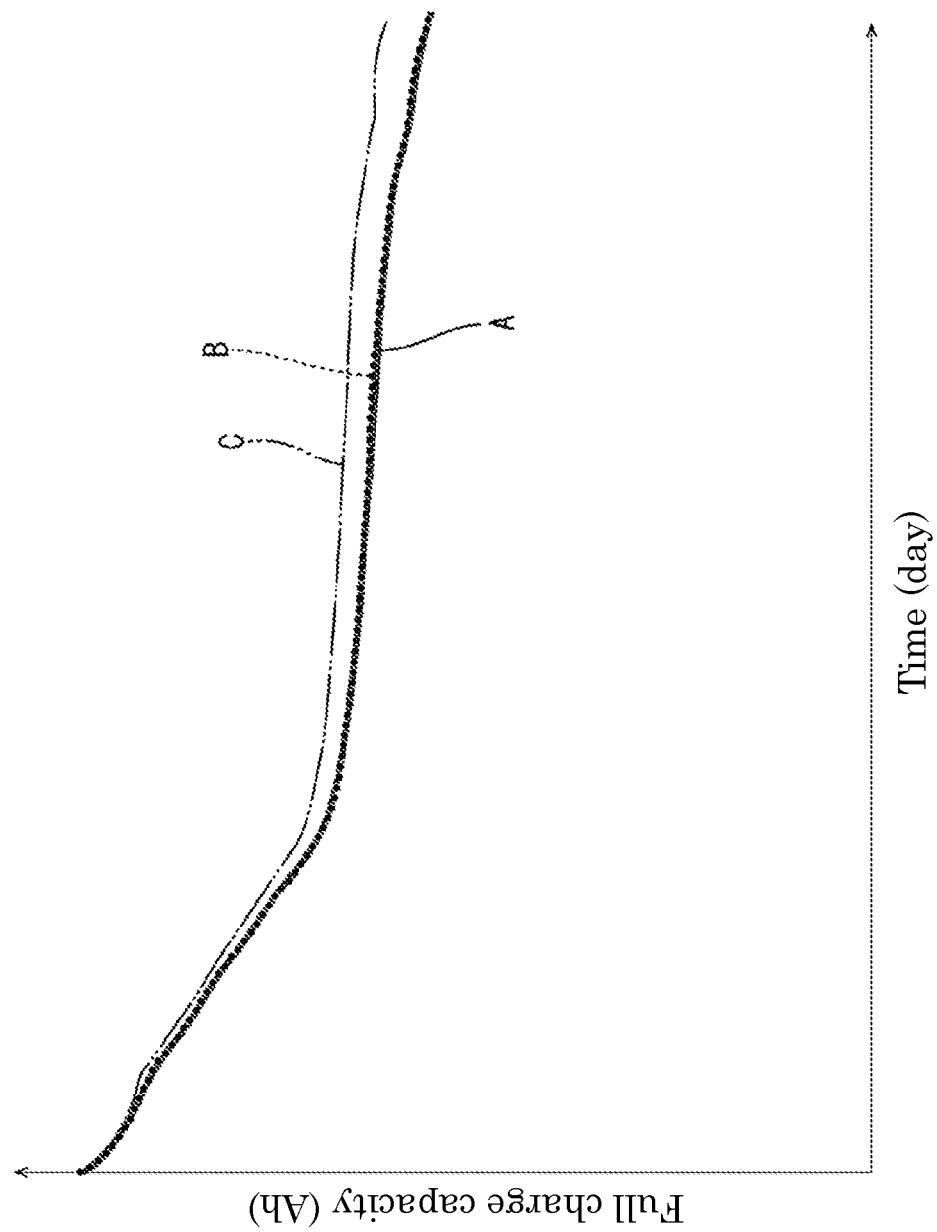
FIG. 22 is a graph illustrating the transition of the full charge capacity of the assembled battery in the fourth embodiment.

The examples are graphs illustrating the temporal transition of the battery capacity of the assembled battery 20 in the first to fourth embodiments. FIG. 19 illustrates the first embodiment, FIG. 20 illustrates the second embodiment, FIG. 21 illustrates the third embodiment, and FIG. 22 illustrates the fourth embodiment.

In the graphs, the vertical axis represents the battery capacity [Ali] of the assembled battery 20, and the horizontal axis represents the time [day].

A solid line A in each graph indicates the temporal transition of the degradation amount in the assembled battery 20 when the separately-calculated degradation amount due to the cycle degradation, the degradation amount estimated by the time degradation estimation processing of the embodiments, and the degradation amount estimated by the off-period degradation estimation processing are added up, a broken line B indicates the temporal transition of the true degradation amount in the assembled battery 20, and an alternate long and two short dashes line C indicates the temporal transition when the off-period degradation estimation processing is not performed (the total of the degradation amount of the cycle degradation and the degradation amount of the time degradation estimation processing).

When the solid line A, the broken line B, and the alternate long and two short dashes line C in FIGS. 19 to 22 are compared to one another, in any of the embodiments, an error between the solid line A and the alternate long and two short dashes line C becomes smaller than an error between the solid line A and the broken line B.

Specifically, the error between the estimated value and the true value of the full charge capacity can be calculated by a root mean square error (RMSE) of the following equation (6). Where Q exp (n) is an estimated value of the full charge capacity, Qorg (n) is a true degradation amount (true value) of the full charge capacity, and n is a number of samplings.

[Mathematical formula 12]

$$RMSE = \frac{\sqrt{\sum (Q_{exp}(n) - Q_{org}(n))^2}}{n} \quad (6)$$

When the results of the embodiments are compared to one another, although the RMSE in the case that the off-period degradation estimation processing of the embodiment is not performed is 0.24, the RMSE in the case that the off-period degradation estimation processing of the first embodiment is performed is 0.01.

The RMSE is 0.03 when the off-period degradation estimation processing of the second embodiment is performed, the RMSE is 0.01 when the off-period degradation estimation processing of the third embodiment is performed, and the RMSE is 0.01 when the off-period degradation estimation processing of the fourth embodiment is performed.

That is, by performing any one of the off-period degradation estimation processes of the first to fourth embodiments, the decrease in the estimation accuracy of the degradation amount of the full charge capacity can be prevented as compared with the case that the off-period degradation estimation processing is not performed.

In the examples, although the RMSEs in the first, third, and fourth embodiments are smaller than that in the second embodiment, the error (RMSE) of the second embodiment tends to become smaller in the case that the temperature of the assembled battery 20 changes gradually during the unmeasured time.

Other Embodiments

The technique disclosed herein is not limited to the embodiments described above with reference to the drawings, but includes, for example, the following various aspects.

(1) In the above embodiment, the energy storage apparatus 10 is applied to the photovoltaic power generating system PS. The present invention is not limited to the embodiments, but the energy storage apparatus may be applied to other facilities and vehicles (such as cars, two-wheeled vehicles, railway vehicles, industrial vehicles), industrial devices (for aviation, space, marine, and harbors), power supply apparatuses, and the like. As an advantage of these apparatuses, even if the power is not supplied to the control apparatus (for example, from the end of operation to the restart of the next operation, the degradation can be estimated during that time, and the prediction close to the actual degradation state can be performed. Consequently, anxiety such as a malfunction during use and the stop on the way is eliminated such that the operable time can accurately be predicted from the capacity prediction of the energy storage device close to the actual energy storage device, and such that a replacement time of the storage element can properly be predicted.

(2) In the above embodiments, the degradation amount of the assembled battery 20 is estimated by the battery temperature of the assembled battery 20. However, the present invention is not limited to the embodiments. Alternatively, the element temperature of each energy storage device constituting the assembled battery may be measured, and the degradation amount in each energy storage device may be calculated to calculate the total degradation amount of the assembled battery.

(3) In the above embodiments, the assembled battery 20 is constructed by connecting four energy storage devices 21 in series. Alternatively, three or less or five or more energy storage devices may be connected in series. Alternatively, the energy storage devices may be arranged in parallel.

(4) In the above embodiments, one assembled battery 20 is used as the energy storage apparatus 10 managed by the battery managing apparatus 30. Alternatively, a plurality of energy storage apparatuses including the assembled battery in which the plurality of energy storage devices are connected in series and the battery managing apparatus may be connected in series to construct a bank. A control apparatus may separately be provided to control the bank, and the battery managing apparatus of the energy storage apparatus and the upper-level control apparatus may share functions. The battery managing apparatus may be a simple battery managing apparatus (what is called a Cell Monitoring Units (CMU)) that acquires sensor information to transmit data to the upper-level control apparatus. A plurality of banks may be connected in parallel to form a domain. Another control apparatus may be provided to control the domain.

(5) In the above embodiments, the BMU 30 is included in the energy storage apparatus 10. Alternatively, an output unit may be provided in the energy storage apparatus and the BMU may independently exist outside the energy storage apparatus, the BMU may be incorporated in another control apparatus, or the BMU may be incorporated in part of software processing of the control apparatus. The function of the BMU may not exist in the system. For example, another server or cloud has the function of the BMU through communication means from the output unit, and an arithmetic operation result or a specific output result (such as the estimated degradation amount, the estimated storage capacity, and the determination result) may be returned from the server or cloud to the energy storage apparatus.

(6) In the above embodiments, the CPU 33 of the BMU 30 performs the time degradation estimation processing read from the memory 34. Alternatively, the energy storage device degradation method may be implemented as a computer program or a storage medium storing the computer program. The computer program estimating the degradation amount of the full charge capacity in the energy storage device causes a computer to perform a step of acquiring the first temperature measured immediately before the energy storage device becomes the power non-supply state and the second temperature initially measured after the energy storage device returns to the power supply state, a step of performing the interpolation based on the first temperature and the second temperature, a step of deciding the temperature of the energy storage device from the measurement time of the first temperature to the measurement time of the second temperature, and a step of estimating the degradation amount of the full charge capacity based on the decided temperature. A plurality of computers may share and execute the processing steps of the computer program.

DESCRIPTION OF REFERENCE SIGNS

10: energy storage apparatus
21: energy storage device

30: battery managing apparatus (an example of the "managing apparatus")
33: CPU (an example of the "controller")
36: timing unit
52: temperature sensor (an example of the "measurement unit")
PC: power conditioner
PV: photovoltaic apparatus

The invention claimed is:

1. An energy storage device managing apparatus that estimates a degradation amount of a full charge capacity of an energy storage device, the energy storage device managing apparatus comprising:
a measurement unit that measures a temperature of the energy storage device in a power supply state in which power is supplied to the energy storage device managing apparatus;
a timing unit that measures time in a power non-supply state in which the power is not supplied to the energy storage device managing apparatus; and
a controller,
wherein the controller performs interpolation based on a first temperature measured immediately before the energy storage device becomes to be in the power non-supply state, and a second temperature initially measured after the energy storage device returns to be in the power supply state, decides a plurality of temperatures of the energy storage device from a measurement time of the first temperature to a measurement time of the second temperature, and estimates the degradation amount of the full charge capacity based on a time variation of the decided temperatures.

2. An energy storage apparatus comprising:
an energy storage device; and
the energy storage device managing apparatus according to claim 1.

3. A photovoltaic power generating system comprising:
a photovoltaic apparatus PV that converts sunlight into power and outputs the power,
a power conditioner PC that converts a DC current generated by the photovoltaic apparatus PV into an AC current; and
the energy storage apparatus according to claim 2.

4. The energy storage device managing apparatus according to claim 1, wherein the measurement unit measures the temperature of the energy storage device only in the power supply state.

5. The energy storage device managing apparatus according to claim 1, wherein the controller estimates the degradation amount of the full charge capacity during the power non-supply state.

6. The energy storage device managing apparatus according to claim 1, wherein the controller is programmed to perform the interpolation.

7. The energy storage device managing apparatus according to claim 6, wherein the controller is further programmed to decide the plurality of temperatures of the energy storage device from the measurement time of the first temperature to the measurement time of the second temperature.

8. The energy storage device managing apparatus according to claim 7, wherein the controller is further programmed to estimate the degradation amount of the full charge capacity based on the time variation of the decided temperatures.

9. An energy storage device managing apparatus that estimates a degradation amount of a full charge capacity of an energy storage device, the energy storage device managing apparatus comprising:
a measurement unit that measures a temperature of the energy storage device in a power supply state in which power is supplied to the energy storage device managing apparatus;
a timing unit that measures time in a power non-supply state in which the power is not supplied to the energy storage device managing apparatus; and
a controller,
wherein the controller performs interpolation based on a first temperature measured immediately before the energy storage device becomes to be in the power non-supply state, and
wherein the controller decides the temperature in each predetermined sampling time in a period from the measurement time of the first temperature to the measurement time of the second temperature, and estimates the degradation amount of the full charge capacity by deciding the degradation amount in each predetermined sampling time based on the temperature in each predetermined sampling time.

10. The energy storage device managing apparatus according to claim 9, wherein the controller decides a temperature in each predetermined sampling time on an assumption that the temperature of the energy storage device with respect to time changes in a curved manner from the measurement time of the first temperature to the measurement time of the second temperature.

11. The energy storage device managing apparatus according to claim 9, wherein the controller decides the temperature in each predetermined sampling time on an assumption that the temperature of the energy storage device with respect to time changes linearly from the measurement time of the first temperature to the measurement time of the second temperature.

12. The energy storage device managing apparatus according to claim 9, wherein the measurement unit measures the temperature of the energy storage device only in the power supply state.

13. The energy storage device managing apparatus according to claim 9, wherein the controller estimates the degradation amount of the full charge capacity during the power non-supply state.

14. The energy storage device managing apparatus according to claim 9, wherein the controller is programmed to perform the interpolation based on the first temperature measured immediately before the energy storage device becomes to be in the power non-supply state.

15. The energy storage device managing apparatus according to claim 14, wherein the controller is further programmed to decide the temperature in each predetermined sampling time in the period from the measurement time of the first temperature to the measurement time of the second temperature.

16. The energy storage device managing apparatus according to claim 15, wherein the controller is further programmed to estimate the degradation amount of the full charge capacity by deciding the degradation amount in each predetermined sampling time based on the temperature in each predetermined sampling time.

17. A degradation amount estimating method of estimating a degradation amount of a full charge capacity of an energy storage device, the degradation amount estimating method comprising:
interpolating based on a first temperature measured immediately before the energy storage device becomes to be in a power non-supply state and a second temperature initially measured after the energy storage device returns to a power supply state; and deciding a temperature of the energy storage device from a measurement time of the first temperature to a measurement time of the second temperature to estimate the degradation amount of the full charge capacity based on the decided temperature, wherein a temperature is decided in each predetermined sampling time in a period from the measurement time of the first temperature to the measurement time of the second temperature, and wherein the degradation amount of the full charge capacity is estimated by deciding the degradation amount in each predetermined sampling time based on the temperature in each predetermined sampling time.

18. The degradation amount estimating method according to claim 17, wherein the degradation amount of the full charge capacity is estimated during the power non-supply state.

19. A computer program estimating a degradation amount of a full charge capacity in an energy storage device causes a computer to perform:

acquiring a first temperature measured immediately before the energy storage device becomes to be in a power non-supply state and a second temperature initially measured after the energy storage device returns to a power supply state;

performing interpolation based on the first temperature and the second temperature;

deciding a temperature of the energy storage device in each predetermined sampling time from a measurement time of the first temperature to a measurement time of the second temperature; and estimating the degradation amount of the full charge capacity in each predetermined sampling time based on the decided temperature in each predetermined sampling time.

* * * * *